(12) United States Patent
Shang et al.

(10) Patent No.: US 12,063,819 B2
(45) Date of Patent: Aug. 13, 2024

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tinghua Shang, Beijing (CN); Lulu Yang, Beijing (CN); Yang Zhou, Beijing (CN); Pengfei Yu, Beijing (CN); Huijuan Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 547 days.

(21) Appl. No.: 17/435,148

(22) PCT Filed: Apr. 15, 2021

(86) PCT No.: PCT/CN2021/087544
§ 371 (c)(1),
(2) Date: Aug. 31, 2021

(87) PCT Pub. No.: WO2021/238489
PCT Pub. Date: Dec. 2, 2021

(65) Prior Publication Data
US 2022/0328579 A1  Oct. 13, 2022

(30) Foreign Application Priority Data
May 29, 2020 (CN) .......................... 202010478304.4

(51) Int. Cl.
*H10K 59/122* (2023.01)
*H10K 50/81* (2023.01)
(Continued)

(52) U.S. Cl.
CPC ....... *H10K 59/122* (2023.02); *H10K 59/1213* (2023.02); *H10K 59/131* (2023.02); *H10K 59/30* (2023.02)

(58) Field of Classification Search
CPC .. H10K 59/1213; H10K 59/131; H10K 59/30; H10K 59/122; H10K 50/81
See application file for complete search history.

(56) References Cited

U.S. PATENT DOCUMENTS

2015/0207094 A1   7/2015  Iwang
2018/0158887 A1   6/2018  Yun et al.
(Continued)

FOREIGN PATENT DOCUMENTS

CN   106206646 A   12/2016
CN   109148739 A   1/2019
(Continued)

OTHER PUBLICATIONS

Extended European Search Report dated Oct. 7, 2022 received in European Patent Application No. EP 21773269.2.

*Primary Examiner* — Antonio B Crite
(74) *Attorney, Agent, or Firm* — Scully, Scott, Murphy & Presser, P.C.

(57) ABSTRACT

A display substrate and a display device are provided. The display substrate includes: a base substrate, a pixel driving circuit layer, a first planarization layer, an anode layer, a light emitting functional layer, and a spacer. The first planarization layer includes a first via hole, the anode layer includes a first anode and a second anode, the first anode includes a first main body portion and a first connection
(Continued)

portion, the second anode includes a second main body portion and a second connection portion, the spacer is located between the first and second main body portions in adjacent anode group rows. An overlapping area between the spacer and the first via hole is less than 20% of an area of the first via hole.

20 Claims, 10 Drawing Sheets

(51) Int. Cl.
*H10K 59/12* (2023.01)
*H10K 59/121* (2023.01)
*H10K 59/124* (2023.01)
*H10K 59/131* (2023.01)
*H10K 59/30* (2023.01)
*H10K 59/35* (2023.01)

(56) References Cited

U.S. PATENT DOCUMENTS

| | | |
|---|---|---|
| 2018/0212007 A1 | 7/2018 | Lee et al. |
| 2018/0350886 A1 | 12/2018 | An et al. |
| 2019/0172893 A1 | 6/2019 | Lee et al. |
| 2019/0252476 A1* | 8/2019 | Chu .................. H10K 50/805 |
| 2020/0343477 A1 | 10/2020 | Zeng et al. |

FOREIGN PATENT DOCUMENTS

| | | |
|---|---|---|
| CN | 110061042 A | 7/2019 |
| CN | 110634886 A | 12/2019 |
| CN | 110690360 A | 1/2020 |
| CN | 110752246 A | 2/2020 |

* cited by examiner

DISPLAY SUBSTRATE AND DISPLAY DEVICE

CROSS-REFERENCE TO RELATED APPLICATIONS

This application is a national phase entry of PCT International Application No. PCT/CN2021/087544, filed on Apr. 15, 2021, which claims priority to Chinese Patent Application No. 202010478304.4 filed on May 29, 2020. The disclosures of PCT International Application No. PCT/CN2021/087544 and Chinese Patent Application No. 202010478304.4 are incorporated by reference herein.

TECHNICAL FIELD

Embodiments of the present disclosure relate to a display substrate and a display device.

BACKGROUND

With the continuous development of display technology, organic light emitting diode (OLED) display technology has been increasingly used in various electronic devices because of its advantages of self-illumination, wide viewing angle, high contrast, low power consumption and high reaction speed.

On the other hand, with the continuous development of organic light emitting diode display technology, people put forward higher requirements for the performance of organic light emitting diode display products such as power consumption, color cast, brightness and stability.

SUMMARY

Embodiments of the disclosure provide a display substrate and a display device. The display substrate includes: a base substrate, a pixel driving circuit layer, a first planarization layer, an anode layer, a light emitting functional layer, and a spacer. The pixel driving circuit layer is located on the base substrate; the first planarization layer is located at a side of the pixel driving circuit layer away from the base substrate; the anode layer is located at a side of the first planarization layer away from the pixel driving circuit layer; a pixel defining layer is located at a side of the anode layer away from the base substrate; the spacer is located at a side of the pixel defining layer away from the anode layer; and the light emitting functional layer is located at a side of the anode layer and the pixel defining layer away from the base substrate. The first planarization layer comprises a first via hole, the anode layer comprises a plurality of anode groups, the plurality of anode groups comprise a plurality of anode group rows, each of the plurality of anode group rows extends along a first direction, the plurality of anode group rows are arranged along a second direction, each of the plurality of anode groups comprises a first anode and a second anode, the first anode comprises a first main body portion and a first connection portion, the second anode comprises a second main body portion and a second connection portion, the plurality of anode group rows comprise a first anode group row and a second anode group row which are adjacent in the second direction, the first main body portion in the first anode group row comprises a first long edge, the second main body portion, which is located in the second anode group row and adjacent to the first main body portion, comprises a second long edge, the first long edge is parallel to the second long edge, extending lines of the first long edge and the second long edge offset from each other, the spacer is located between the first main body portion in the first anode group row and the second main body portion which is located in the second anode group row and adjacent to the first main body portion, the pixel driving circuit layer comprises a first pixel driving circuit, the light emitting functional layer comprises a first light emitting portion, and the first connection portion is electrically connected with the first pixel driving circuit through the first via hole. An overlapping area between an orthographic projection of the spacer on the base substrate and an orthographic projection of the first via hole on the base substrate is less than 20% of an area of an orthographic projection of the first via hole on the base substrate. By reducing the overlapping area between the spacer and the first via hole or even avoiding the overlapping between the spacer and the first via hole, the display substrate can guarantee the integrity of the top of the spacer, and avoid the phenomenon that the top of the spacer is uneven. The display substrate can prevent the fine metal mask from scratching off the material on the spacer and generating particles. Therefore, the product yield of the display substrate can be improved.

At least one embodiment of the disclosure provides a display substrate comprising: a base substrate; a pixel driving circuit layer, located on the base substrate; a first planarization layer, located at a side of the pixel driving circuit layer away from the base substrate; an anode layer, located at a side of the first planarization layer away from the pixel driving circuit layer; a pixel defining layer, located at a side of the anode layer away from the base substrate; a spacer, located at a side of the pixel defining layer away from the anode layer; and a light emitting functional layer, located at a side of the anode layer and the pixel defining layer away from the base substrate. The first planarization layer comprises a first via hole, the anode layer comprises a plurality of anode groups, the plurality of anode groups comprise a plurality of anode group rows, each of the plurality of anode group rows extends along a first direction, the plurality of anode group rows are arranged along a second direction, each of the plurality of anode groups comprises a first anode and a second anode, the first anode comprises a first main body portion and a first connection portion, the second anode comprises a second main body portion and a second connection portion. The plurality of anode group rows comprise a first anode group row and a second anode group row which are adjacent in the second direction, the first main body portion in the first anode group row comprises a first long edge, the second main body portion, which is located in the second anode group row and adjacent to the first main body portion, comprises a second long edge, the first long edge is parallel to the second long edge, extending lines of the first long edge and the second long edge offset from each other, the spacer is located between the first main body portion in the first anode group row and the second main body portion which is located in the second anode group row and adjacent to the first main body portion. The pixel driving circuit layer comprises a first pixel driving circuit, the light emitting functional layer comprises a first light emitting portion, and the first connection portion is electrically connected with the first pixel driving circuit through the first via hole. An overlapping area between an orthographic projection of the spacer on the base substrate and an orthographic projection of the first via hole on the base substrate is less than 20% of an area of an orthographic projection of the first via hole on the base substrate.

For example, in the display substrate according to an embodiment of the disclosure, at least two insulating layers are arranged between the anode layer and the base substrate, and the at least two insulating layers comprise at least one organic insulating layer, and an overlapping area between the orthographic projection of the spacer on the base substrate and an orthographic projection of a via hole in the organic insulating layer is less than 20% of an area of the orthographic projection of the via hole on the base substrate.

For example, in the display substrate according to an embodiment of the disclosure, the orthographic projection of the spacer on the base substrate overlaps with an orthographic projection of the first connection portion on the base substrate.

For example, in the display substrate according to an embodiment of the disclosure, a distance between an orthographic projection of a top of the spacer away from the base substrate on the base substrate and the orthographic projection of the first via hole on the base substrate is greater than 1 micron.

For example, in the display substrate according to an embodiment of the disclosure, the orthographic projection of the spacer on the base substrate is spaced apart from the orthographic projection of the first via hole on the base substrate.

For example, in the display substrate according to an embodiment of the disclosure, an orthographic projection of a top of the spacer away from the base substrate on the base substrate is spaced apart from an edge of the orthographic projection of the first light emitting portion on the base substrate.

For example, in the display substrate according to an embodiment of the disclosure, the light emitting functional layer comprises a plurality of light emitting groups, the plurality of light emitting groups are arranged along a first direction to form a plurality of light emitting group columns and arranged along a second direction to form a plurality of light emitting group rows, each of the plurality of light emitting group comprises a first light emitting portion, a second light emitting portion, a third light emitting portion and a fourth light emitting portion, the third light emitting portion and the fourth light emitting portion are arranged along the second direction to form a light emitting pair, the first light emitting portion, the light emitting pair and the second light emitting portion are arranged along the first direction, two adjacent ones of the plurality of light emitting group rows offset from each other, the first planarization layer further comprises a second via hole, a third via hole and a fourth via hole, the anode layer further comprises a third anode and a fourth anode, the pixel driving circuit layer further comprises a second pixel driving circuit, a third pixel driving circuit, and a fourth pixel driving circuit, the second anode is connected with the second pixel driving circuit through the second via hole, the third anode is connected with the third pixel driving circuit through the third via hole, and the fourth anode is connected with the fourth pixel driving circuit though the fourth via hole, centers of multiple fourth via holes corresponding to each of the plurality of light emitting group rows are approximately located on a first straight line extending along the first direction, and the orthographic projection of the first via hole on the base substrate is located at a side of the first straight line close to the first main body portion.

For example, in the display substrate according to an embodiment of the disclosure, centers of multiple first via holes corresponding to each of the plurality of light emitting group rows are approximately located on a second straight line extending along the first direction, and centers of multiple second via holes corresponding to each of the plurality of light emitting group rows are approximately located on a third straight line extending along the first direction, in the same one of the plurality of light emitting group rows, the second straight line is located at a side of the third straight line close to the first main body portion.

For example, in the display substrate according to an embodiment of the disclosure, an orthographic projection of a top of the spacer on the base substrate is located among an orthographic projection of the first light emitting portion on the base substrate, an orthographic projection of the fourth light emitting portion on the base substrate, and an orthographic projection of the second light emitting portion, which is in an adjacent light emitting group in the second direction, on the base substrate.

For example, in the display substrate according to an embodiment of the disclosure, the fourth anode further comprises a supplementary portion, and an orthographic projection of the supplementary portion on the base substrate covers an orthographic projection of a channel region of a compensation thin film transistor in the fourth pixel driving circuit corresponding to the fourth anode on the base substrate.

For example, the display substrate according to an embodiment of the disclosure further comprises: a second planarization layer, located between the pixel driving circuit layer and the first planarization layer; and a conductive layer, located between the second planarization layer and the first planarization layer, wherein the conductive layer comprises a first electrode block, a second electrode block, a third electrode block and a fourth electrode block, the first electrode block is connected with a drain electrode of the first pixel driving circuit, the second electrode block is connected with a drain electrode of the second pixel driving circuit, the third electrode block is connected with a drain electrode of the third pixel driving circuit, the fourth electrode block is connected with a drain electrode of the fourth pixel driving circuit, the first anode is connected with the first electrode block through the first via hole, the second anode is connected with the second electrode block through the second via hole, the third anode is connected with the third electrode block through the third via hole, and the fourth anode is connected with the fourth electrode block through the fourth via hole, a size of the first electrode block in the second direction is larger than a size of the fourth electrode block in the second direction.

For example, in the display substrate according to an embodiment of the disclosure, the pixel driving circuit layer comprises: a semiconductor layer, located on the base substrate; and a source drain metal layer, located at a side of the semiconductor layer away from the base substrate, wherein the source drain metal layer comprises a first drain electrode block, a second drain electrode block, a third drain electrode block and a fourth drain electrode block, the first drain electrode block serves as a drain electrode of the first pixel driving circuit, the second drain electrode block serves as a drain electrode of the second pixel driving circuit, the third drain electrode block serves as a drain electrode of the third pixel driving circuit and the fourth drain electrode block serves as a drain electrode of the fourth pixel driving circuit.

For example, in the display substrate according to an embodiment of the disclosure, the first anode is connected with the first drain electrode block through the first via hole, the second anode is connected with the second drain electrode block through the second via hole, the third anode is connected with the third drain electrode block through the third via hole, and the fourth anode is connected with the fourth drain electrode block through the fourth via hole, a size of the first drain electrode block in the second direction is larger than a size of the fourth drain electrode block in the second direction.

For example, in the display substrate according to an embodiment of the disclosure, an area of the first drain electrode block is larger than an area of the second drain electrode block, the area of the second drain electrode block is larger than an area of the fourth drain electrode block, and the area of the fourth drain electrode block is equal to an area of the third drain electrode block.

For example, the display substrate according to an embodiment of the disclosure further comprises: an interlayer insulating layer, located at a side of the source drain metal layer close to the semiconductor layer, wherein the interlayer insulating layer comprises a first contact hole, a second contact hole, a third contact hole and a fourth contact hole, the first drain electrode block is connected with the semiconductor layer through the first contact hole, the second drain electrode block is connected with the semiconductor layer through the second contact hole, and the third drain electrode block is connected with the semiconductor layer through the third contact hole, the fourth drain electrode block is connected with the semiconductor layer through the fourth contact hole; multiple first contact holes, multiple fourth contact holes, and multiple second contact holes corresponding to each of the plurality of light emitting group rows are approximately located on a fourth straight line extending along the first direction.

For example, in the display substrate according to an embodiment of the disclosure, the first drain electrode block comprises a first rectangular portion, a first wedge-shaped portion and a second rectangular portion, the first rectangular portion is connected with the semiconductor layer through the first contact hole, an edge length of the second rectangular portion is longer than an edge length of the first rectangular portion, a short bottom edge of the first wedge-shaped portion is connected with the first rectangular portion, and a long bottom edge of the first wedge-shaped portion is connected with the second rectangular portion, the fourth drain electrode block comprises a third rectangular portion and a fourth rectangular portion, the third rectangular portion is connected with the semiconductor layer through the third contact hole, and an edge length of the fourth rectangular portion is longer than an edge length of the third rectangular portion.

For example, in the display substrate according to an embodiment of the disclosure, the source drain metal layer further comprises: a power supply line, extending along the second direction; and a data line, extending along the second direction, wherein the orthographic projection of the spacer on the base substrate is spaced apart from an orthographic projection of the power supply line and an orthographic projection of the data line on the base substrate, respectively.

For example, in the display substrate according to an embodiment of the disclosure, the pixel driving circuit layer comprises: a first gate electrode layer, located at a side of the semiconductor layer away from the base substrate; and a second gate electrode layer, located at a side of the first gate electrode layer away from the semiconductor layer, wherein the semiconductor layer comprises a plurality of pixel driving units which are respectively arranged corresponding to the first anode, the second anode, the third anode and the fourth anode, and each of the plurality of pixel driving units comprises a first unit, a second unit, a third unit, a fourth unit, a fifth unit, a sixth unit and a seventh unit, the first unit comprises a first channel region, and a first source region and a first drain region which are located at two sides of the first channel region, the second unit comprises a second channel region, and a second source region and a second drain region which are located at two sides of the second channel region, the third unit comprises a third channel region and a third source region and a third drain region which are located at two sides of the third channel region, the fourth unit comprises a fourth channel region and a fourth source region and a fourth drain region which are located at two sides of the fourth channel region, the fifth unit comprises a fifth channel region and a fifth source region and a fifth drain region which are located at two sides of the fifth channel region, the sixth unit comprises a sixth channel region and a sixth source region and a sixth drain region which are located at two sides of the sixth channel region, and the seventh unit comprises a seventh channel region and a seventh source region and a seventh drain region which are located at two sides of the seventh channel region, the third source region, the first drain region and the fifth source region are connected to a first node, the sixth drain region is connected with the third drain region, the first source region, the second drain region and the fourth drain region are connected to a second node, the fifth drain region is connected with the seventh drain region in an adjacent row, the first gate electrode layer comprises a reset signal line, a gate line, a first electrode plate and an emission control line, the reset signal line overlaps with the seventh channel region and the sixth channel region to form a seventh thin film transistor and a sixth thin film transistor with the seventh unit and the sixth unit, the gate line overlaps with the third channel region and the second channel region respectively to form a third thin film transistor and a second thin film transistor with the third unit and the second unit, the first electrode plate overlaps with the first channel region to form a first thin film transistor with the first unit, and the emission control line overlaps with the fourth channel region and the fifth channel region to form a fourth thin film transistor and a fifth thin film transistor with the fourth unit and the fifth unit, the second gate electrode layer comprises an initialization signal line and a second electrode plate, the initialization signal line is connected with the seventh source region and the sixth source region, and an orthographic projection of the second electrode plate on the base substrate at least partially overlaps with an orthographic projection of the first electrode plate on the base substrate to form a storage capacitor.

For example, in the display substrate according to an embodiment of the disclosure, the source drain metal layer further comprises: a first connection block, connected with the initialization signal line, the sixth source region and the seventh source region; and a second connection block, connected with the third drain region and the first electrode plate, wherein the orthographic projection of the spacer on the base substrate is spaced apart from an orthographic projection of the first connection block on the base substrate and an orthographic projection of the second connection block on the base substrate.

For example, in the display substrate according to an embodiment of the disclosure, the source drain metal layer further comprises: a cushion block, located between the second connection block and the data line, wherein the power supply line closest to the data line is located at a side of the data line away from the cushion block, an orthographic projection of the data line on the base substrate passes through a central part of an orthographic projection of the first main body portion on the base substrate, an orthographic projection of the cushion block on the base substrate overlaps with the orthographic projection of the first main body portion on the base substrate, and an orthographic projection of the power supply line closest to the data line on the base substrate overlaps with the orthographic projection of the first main body portion on the base substrate.

For example, in the display substrate according to an embodiment of the disclosure, the second anode comprises a second main body portion and a second connection portion, the second connection portion is electrically connected with the second pixel driving circuit through the second via hole, the third anode comprises a third main body portion and a third connection portion, the third connection portion is electrically connected with the third pixel driving circuit through the third via hole, and the fourth anode comprises a fourth main body portion and a fourth connection portion, the fourth connection portion is electrically connected with the fourth pixel driving circuit through the fourth via hole, the pixel defining layer comprises a first opening, a second opening, a third opening and a fourth opening, the first light emitting portion is at least partially located in the first opening and covers an exposed part of the first main body portion, the second light emitting portion is at least partially located in the second opening and covers an exposed part of the second main body portion, the third light emitting portion is at least partially located in the third opening and covers an exposed part of the third main body portion, and the fourth light emitting portion is at least partially located in the fourth opening and covers an exposed part of the fourth main body portion.

For example, in the display substrate according to an embodiment of the disclosure, a shape of an orthographic projection of the first opening on the base substrate is a hexagonal shape or an elliptical shape, and a shape of the orthographic projection of the spacer on the base substrate is an elongated shape or a rounded rectangular shape, an included angle between a long axis direction of the shape of the orthographic projection of the first opening on the base substrate and an extending direction of the orthographic projection of the spacer on the base substrate is in a range from 20 to 70 degrees.

For example, in the display substrate according to an embodiment of the disclosure, the extending direction of the orthographic projection of the spacer on the base substrate is approximately parallel to an extending direction of an edge, which is close to the spacer, of the orthographic projection of the first opening on the base substrate.

For example, in the display substrate according to an embodiment of the disclosure, the display substrate comprises a plurality of spacers, and connecting lines of centers of the plurality of spacers form a plurality of rhombic shapes.

For example, in the display substrate according to an embodiment of the disclosure, the first light emitting portion is configured to emit light of a first color, the third light emitting portion and the fourth light emitting portion are configured to emit light of a second color, and the second light emitting portion is configured to emit light of a third color.

For example, in the display substrate according to an embodiment of the disclosure, the first color is red, the second color is green, and the third color is blue.

For example, in the display substrate according to an embodiment of the disclosure, the first direction and the second direction are substantially perpendicular to each other.

At least one embodiment of the disclosure provides a display device comprising the display substrate according to any items mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components.

Figure 1:
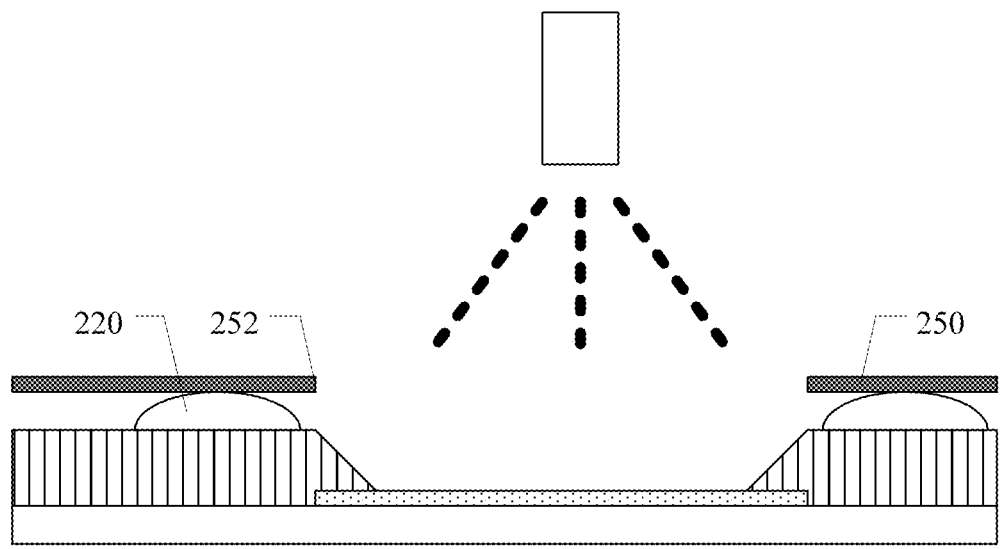
FIG. 1 is a schematic diagram of an evaporation process of an organic light emitting diode display substrate.

In the related art, a manufacturing process of an organic light emitting diode display substrate includes a step of evaporating a light emitting functional layer at an opening of a pixel define layer (PDL). FIG. 1 is a schematic diagram of an evaporation process of an organic light emitting diode display substrate. As illustrated by FIG. 1, a fine metal mask (FMM) 250 is needed to limit an evaporation range during the evaporation process. In this case, a spacer 220 is provided on the display substrate to support the fine metal mask 250. However, upon the spacer 220 being in contact with the fine metal mask 250, an edge 252 of an opening on the fine metal mask 250 is easy to scratch the spacer 220 and generate particles, which will lead to defects such as poor packaging, thus reducing the yield of the display substrate. In this case, as illustrated by FIG. 1, by setting the edge of the opening of the fine metal mask away from the middle position of the spacer, the problem that the edge of the opening on the fine metal mask scratches the spacer and generates particles can be alleviated or solved.

Figure 2A:
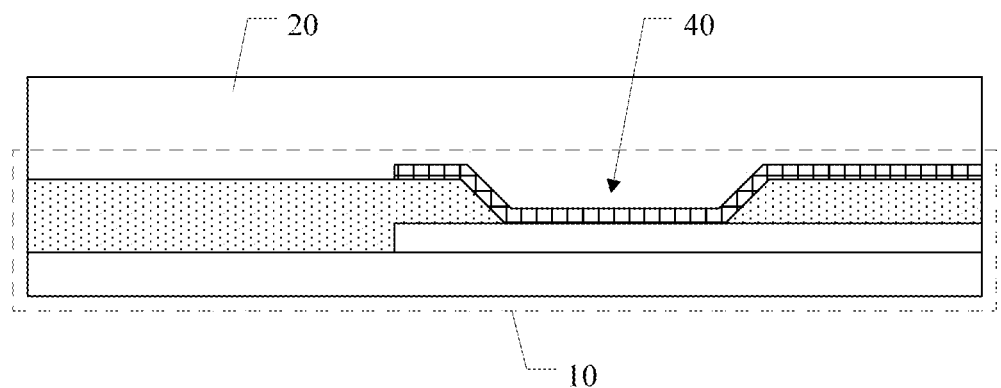
FIGS. 2A-2C show a manufacturing process of spacers on an organic light emitting diode display substrate.
Figure 2B:
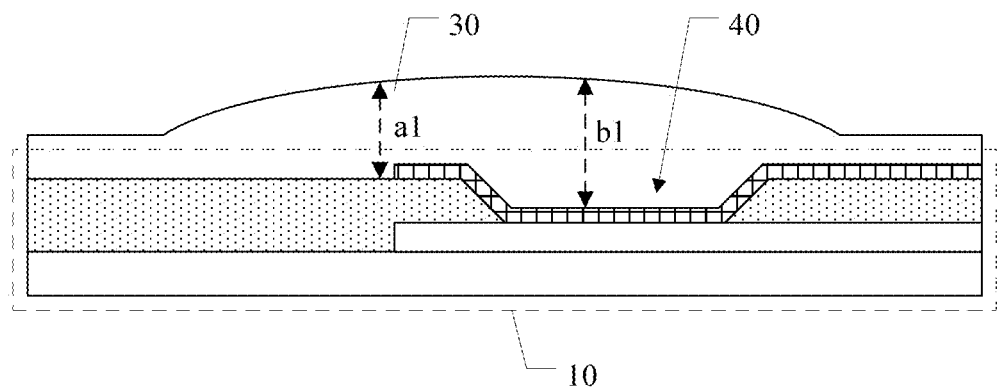
Figure 2C:
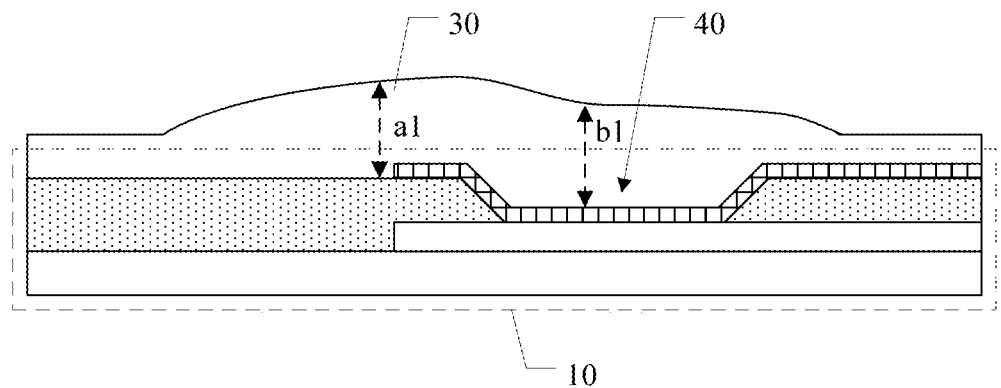

On the other hand, FIGS. 2A-2C show a manufacturing process of a spacer on an organic light emitting diode display substrate provided by the related art. As illustrated by FIG. 2A, a material layer 20 (e.g., a photoresist material layer) is formed on a display substrate 10 by a glue-applying process. As illustrated by FIG. 2B, the material layer 20 is subjected to an exposure process and a development process to form a spacer 30. In this case, the structure of the spacer 30 has been preliminarily formed. However, in the case where there is a via hole 40 (for example, a PLN hole) under the spacer 30, the absolute heights of the spacer 30 at position a1 and position b1 are the same, but the film thicknesses of the spacer 30 at the position a1 and the position b1 are different, that is, $a1 \neq b1$. As illustrated by FIG. 2C, after the above-mentioned exposure and development processes, a curing process (e.g., a thermal curing process) is required to cure the spacer 30 as preliminarily formed. In the above-mentioned curing process, a chemical reaction occurs inside the spacer 30 to produce a polymer, thereby forming a stable structure. In this case, with the volatilization of solvent and the progress of the chemical reaction, the film layers at different positions of the spacer 30 will be thinned proportionally. The film thicknesses of the spacer 30 at the positions a1 and the position b1 are different ($a1 \neq b1$), so the thinned film thicknesses of the spacer 30 at the position a1 and the position b1 are different, i.e., $a1-a2 \neq b1-b2$, so the absolute heights of the cured spacer 30 at the position a1 and the position b1 are also different. As illustrated by FIG. 2C, the absolute height of the film layer of the spacer 30 on the via hole 40 is smaller than other positions. In this case, because the top of the spacer 30 is uneven, even if the opening edge of the fine metal mask is set away from the middle position of the spacer, upon the fine metal mask coming into contact with the spacer, the fine metal mask will easily scratch off the material on the spacer and generate particles. For example, as illustrated by FIG. 2C, the absolute height of a portion of the cured spacer 30 at the position a1 is greater than that the absolute height of a portion of the cured spacer 30 at the position b1, so that the portion of the spacer 30 with the maximum height deviates from the middle position of the spacer 30 to the edge position. In this case, even if the opening edge of the fine metal mask is set away from the middle position of the spacer, the fine metal mask is easy to contact and scratch the portion of the spacer with the maximum height, thereby easily scratching off the material on the spacer and generating particles.

In this regard, embodiments of the present disclosure provide a display substrate and a display device. The display substrate includes a base substrate, a pixel driving circuit layer, a first planarization layer, an anode layer, a light emitting functional layer and a spacer; the pixel driving circuit layer is located on the base substrate, the first planarization layer is located at a side of the pixel driving circuit layer away from the base substrate, the anode layer is located at a side of anode layer away from the base substrate, the pixel defining layer is located at a side of the anode layer away from the base substrate, the spacer is located at a side of the pixel defining layer away from the anode layer, and the light emitting functional layer is located at a side of the anode layer and the pixel defining layer away from the base substrate. The first planarization layer includes a first via hole, the anode layer includes a plurality of anode groups which include a plurality of anode group rows, each of the plurality of anode group rows extends along a first direction, and the plurality of anode group rows are arranged along a second direction; each of the anode groups includes a first anode and a second anode, the first anode includes a first main body portion and a first connection portion, the second anode includes a second main body portion and a second connection portion; the plurality of anode group rows include a first anode group row and a second anode group row which are adjacent in the second direction; the first main body portion in the first anode group row includes a first long edge extending along the second direction, and the second main body portion located in the second anode group row and adjacent to the first main body portion has a second long edge extending along the second direction, the first long edge is parallel to the second long edge, extending lines of the first long edge and the second long edge offset from each other, the spacer is located between the first main body portion in the first anode group row and the second main body portion which is located in the second anode group row and adjacent to the first main body portion, the pixel driving circuit layer comprises a first pixel driving circuit, the light emitting functional layer comprises a first light emitting portion, and the first connection portion is electrically connected with the first pixel driving circuit through the first via hole, an overlapping area between an orthographic projection of the spacer on the base substrate and an orthographic projection of the first via hole on the base substrate is less than 20% of an area of an orthographic projection of the first via hole on the base substrate. By reducing the overlapping area of the spacer and the first via hole and even avoiding the overlapping of the spacer and the first via hole, the display substrate can guarantee the integrity of the top of the spacer, and avoid the phenomenon that the top of the spacer is uneven. The display substrate can prevent the fine metal mask from scratching off the material on the spacer and generating particles. Therefore, the display substrate can improve the product yield.

Hereinafter, the display substrate and the display device provided by the embodiments of the present disclosure will be described in detail with reference to the drawings.

Figure 3:
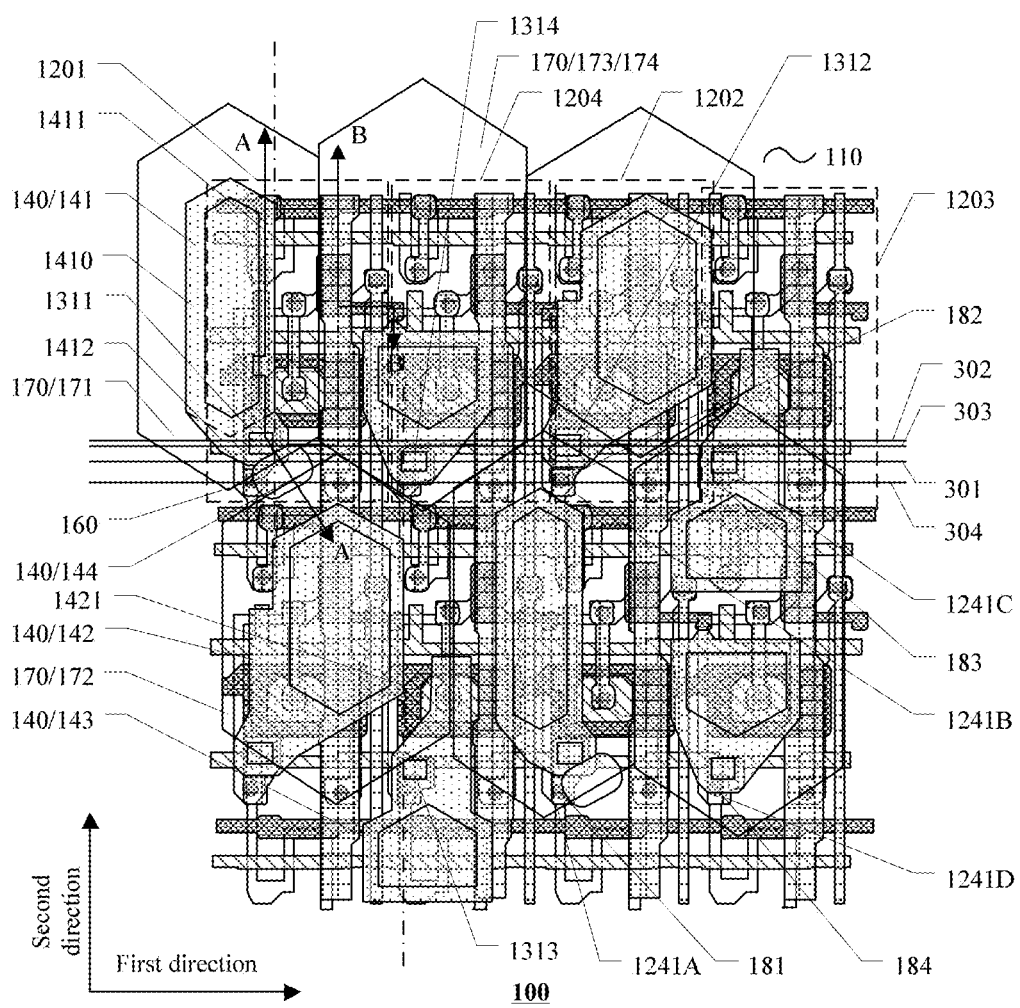
FIG. 3 is a schematic planar view of a display substrate according to an embodiment of the present disclosure.
Figure 4:
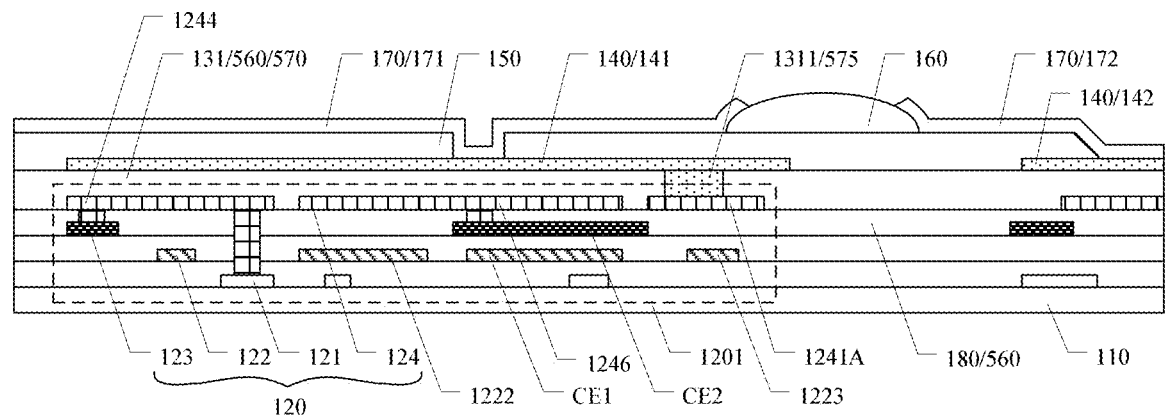
FIG. 4 is a schematic cross-sectional view of a display substrate according to an embodiment of the present disclosure along the AA direction in FIG. 3.
Figure 5A:
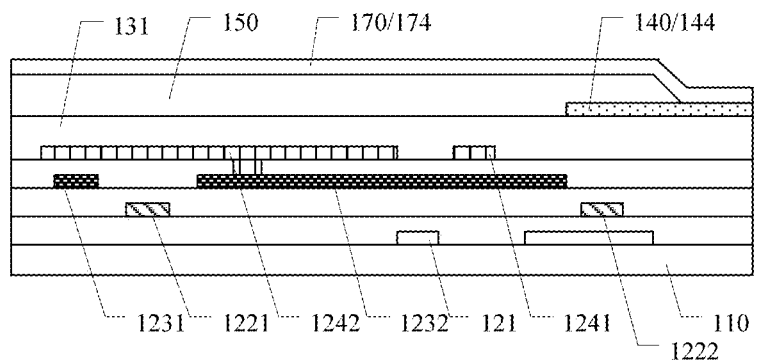
FIG. 5A is a schematic cross-sectional view of a display substrate according to an embodiment of the present disclosure along the BB direction in FIG. 3.
Figure 5B:
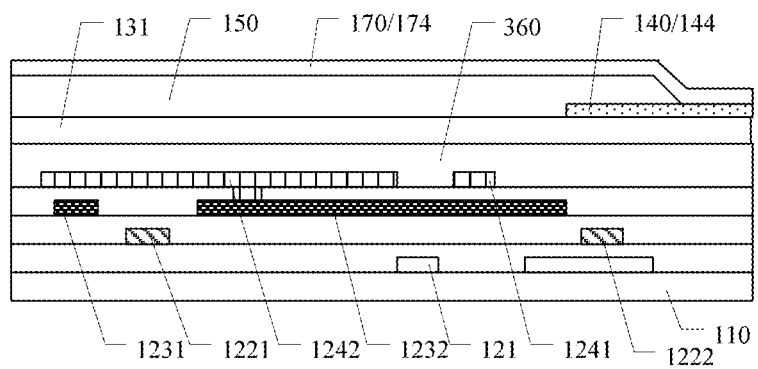
FIG. 5B is a schematic cross-sectional view of another display substrate according to an embodiment of the present disclosure along the BB direction in FIG. 3.

An embodiment of the present disclosure provides a display substrate. FIG. 3 is a schematic planar view of a display substrate according to an embodiment of the present disclosure; FIG. 4 is a schematic cross-sectional view of a display substrate according to an embodiment of the present disclosure along the AA direction in FIG. 3; FIG. 5A is a schematic cross-sectional view of a display substrate according to an embodiment of the present disclosure along the BB direction in FIG. 3; FIG. 5B is a schematic cross-sectional view of a display substrate according to an embodiment of the present disclosure along the BB direction in FIG. 3.

As illustrated by FIGS. 3, 4, 5A and 5B, the display substrate 100 includes a base substrate 110, a pixel driving circuit layer 120, a first planarization layer 131, an anode layer 140, a pixel defining layer 150, a spacer 160 and a light emitting functional layer 170. The pixel driving circuit layer 120 is located on the base substrate 110, the first planarization layer 131 is located at a side of the pixel driving circuit layer 120 away from base substrate 110, the anode layer 140 is located at a side of the anode layer 140 away from the base substrate 110, the pixel defining layer 150 is located at a side of the anode layer 140 away from the base substrate 110, the spacer 160 is located at a side of the pixel defining layer 150 away from the anode layer 140, and the light emitting functional layer 170 is located at a side of the anode layer 170 and the pixel defining layer 150 away from the base substrate 110.

For example, the base substrate can be a transparent substrate such as a glass substrate, a plastic substrate, and a quartz substrate. The base substrate can also be a flexible substrate. The above-mentioned pixel driving circuit layer can adopt a common pixel driving circuit structure for driving an organic light emitting diode display panel to emit light, such as a 7T1C structure. Of course, embodiments of the present disclosure include but are not limited thereto. The anode layer can be made of a transparent oxide material such as indium tin oxide (ITO), or a metal material such as silver, copper and aluminum. The light emitting functional layer may include an organic light emitting layer and other functional layers for emitting light, such as a hole transport layer, an electron transport layer, and the like.

As illustrated by FIG. 3, FIG. 4, FIG. 5A and FIG. 5B, the first planarization layer 131 includes a first via hole 1311, and the anode layer 140 includes a plurality of anode groups 1400, the plurality of anode groups 1400 include a plurality of anode group rows 390, each of the anode group rows 390 extends along a first direction, and the plurality of anode group rows 390 are arranged along a second direction. Each of the anode groups 1400 includes a first anode 141 and a second anode 142, the first anode 141 includes a first main body portion 1410 and a first connection portion 1412, the second anode 142 includes a second main body portion 1420 and a second connection portion 1422; the plurality of anode group rows 390 include a first anode group row 391 and a second anode group row 392 which are adjacent in the second direction; the first main body portion 1410 in the first anode group rows 391 has a first long edge 1411, the second main body portion 1420 which is located in the second anode group row 392 and adjacent to the first main body portion 1410 has a second long edge 1421, the first long edge 1411 is parallel to the second long edge 1421, and the extension lines of the first long edge 1411 and the second long edge 1421 offset from each other. The spacer 160 is located between the first main body portion 1410 in the first anode group row 391 and the second main body portion 1420 which is located in the second anode group row 392 and adjacent to the first main body portion 1410. The pixel driving circuit layer 120 includes a first pixel driving circuit 1201, and the light emitting functional layer 170 includes a first light emitting portion 171. For example, the first main body portion 1410 can be arranged in contact with the first light emitting portion 171, and the first connection portion 1412 is electrically connected with the first pixel driving circuit 1201 through the first via hole 1311. An overlapping area between an orthographic projection of the spacer 160 and an orthographic projection of the first via hole 1311 on the base substrate 110 is less than 20% of the area of an orthographic projection of the first via hole 1311 on the base substrate 110. It should be noted that the case that the overlapping area between the orthographic projection of the spacer and the orthographic projection of the first via hole on the base substrate is less than 20% of the area of the orthographic projection of the first via hole on the base substrate includes the case that the orthographic projection of the spacer on the base substrate does not overlap with the orthographic projection of the first via hole on the base substrate, that is, the overlapping area is zero. In addition, the first long edge and the second long edge are located on the same side of the first main body portion and the second main body portion, for example, the first long edge is the long edge on the right side of the first main body portion and the second long edge is the long edge on the right side of the second main body portion.

In the display substrate provided by the embodiment of the present disclosure, the overlapping area between the orthographic projection of the spacer on the base substrate and the orthographic projection of the first via hole on the base substrate is less than 20% of the area of the orthographic projection of the first via hole on the base substrate. By reducing the overlapping area of the spacer and the first via hole and even avoiding the overlapping of the spacer and the first via hole, the display substrate can guarantee the integrity of the top of the spacer, and avoid the phenomenon that the top of the spacer is uneven. Therefore, the display substrate can effectively prevent the opening edge of the fine metal mask from contacting or scratching the portion of the spacer with the maximum height, thereby preventing the fine metal mask from scratching off the material on the spacer and generating particles, and further improving the product yield.

In some examples, as illustrated by FIG. 3, the first main body portion 1410 of the first anode 141 refers to a portion for driving the first light emitting portion 171 corresponding to the first anode 141 to emit light. In the case where the pixel defining layer 150 includes a first opening 151, the first light emitting portion 171 at least partially falls into the first opening 151 and is electrically connected with the first main body portion 1410 through the first opening 151, so that the first main body portion 1410 can drive the first light emitting portion 171 to emit light. The first light emitting portion 171 can be electrically connected by directly contacting with the first main body portion 1410, or a functional film layer such as a hole transport layer and a hole injection layer can be provided between the first light emitting portion 171 and the first main body portion 1410. The shape of the first main body portion 1410 is substantially the same as that of the first opening 151. Similarly, the second main body portion 1420 of the second anode 142 refers to a portion for driving the second light emitting portion 172 corresponding to the second anode 142 to emit light. In the case where the pixel defining layer 150 includes a second opening 152, the second light emitting portion 172 at least partially falls into the second opening 152 and is electrically connected with the second main body portion 1420 through the second opening 152, so that the second main body portion 1420 can drive the second light emitting portion 172 to emit light. The second light emitting portion 172 can be electrically connected by directly contacting with the second main body portion 1420, or a functional film layer such as a hole transport layer and a hole injection layer can be provided between the second light emitting portion 172 and the second main body portion 1420. The shape of the second main body portion 1420 is substantially the same as that of the second opening 152. The shape of the main body of the anode can also be different from the shape of the corresponding opening; in addition to the main body portion and the connection portion, the anode may also include a supplementary portion and the like.

In some examples, the pixel defining layer includes a plurality of opening groups including a plurality of opening group rows, each of the plurality of opening group rows extends along the first direction and the plurality of opening group rows are arranged along the second direction, each of the opening groups includes a first opening and a second opening; the plurality of opening group rows include a first opening group row and a second opening group row which are adjacent in the second direction, the first opening in the first opening group row includes a third long edge, and the second opening which is located in the second opening group row and adjacent to the first opening includes a fourth long edge. The third long edge is parallel to the fourth long edge, and the extension lines of the third long edge and the fourth long edge offset from each other, the spacer is located between the first opening in the first opening group row and the second opening which is located in the second opening group row and adjacent to the first opening.

In some examples, as illustrated by FIG. 3, the orthographic projection of the spacer 160 on the base substrate 110 overlaps with the orthographic projection of the first connection portion 1412 on the base substrate 110.

In some examples, as illustrated by FIGS. 3, 4, 5A and 5B, at least two insulating layers 560 are disposed between the anode layer 140 and the base substrate 110, and the at least two insulating layers 560 include at least one organic insulating layer 570; an overlapping area between the orthographic projection of the spacer 160 on the base substrate 110 and the orthographic projection of a via hole 575 in the organic insulating layer 570 on the base substrate 110 is less than 20% of the area of the orthographic projection of the via hole 575 on the base substrate 110. By reducing the overlapping area of the spacer and the first via hole and even avoiding the overlapping of the spacer and the first via hole, the display substrate can guarantee the integrity of the top of the spacer, and avoid the phenomenon that the top of the spacer is uneven.

It should be noted that, in the display substrate, the planarization layer is usually made of an organic material, that is, the above-mentioned organic insulating layer can be a planarization layer. In the case where an organic insulating layer is arranged between the anode layer and the base substrate, the organic insulating layer can be the first planarization layer. The overlapping area between the orthographic projection of the spacer on the base substrate and the orthographic projection of the via hole in the organic insulation layer on the substrate is less than 20% of the area of the orthographic projection of the via hole on the base substrate. In the case where two organic insulating layers are arranged between the anode layer and the base substrate, the overlapping area between the orthographic projection of the spacer on the base substrate and the orthographic projection of the respective via holes in the two organic insulating layers on the base substrate is less than 20% of the area of the orthographic projection of the corresponding via hole on the base substrate.

In some examples, as illustrated by FIG. 3, a distance between an orthographic projection of the top of the spacer 160 away from the base substrate 110 on the base substrate 110 and the orthographic projection of the first via hole 1311 on the base substrate 110 is greater than 1 micron. Therefore, the display substrate can avoid that the portion around the top of the spacer does not overlap with the first via hole, thereby effectively ensuring the integrity of the top of the spacer and avoiding the phenomenon that the top of the spacer is uneven. It should be noted that, the top of the spacer mentioned above refers to a portion of the spacer away from the base substrate, which is usually a portion with a larger thickness, for example, a portion with a thickness of 80%-100% of the maximum thickness of the spacer.

In some examples, as illustrated by FIG. 3, the orthographic projection of the top of the spacer 160 away from the base substrate 110 on the base substrate 100 is spaced apart from an edge of an orthographic projection of the first light emitting portion 171 on the base substrate 110. In this case, in the manufacturing process of the display substrate, upon the first light emitting portion being formed through an evaporation process by using a fine metal mask, the orthographic projection of the opening edge of the fine metal mask on the base substrate is spaced apart from the orthographic projection of the top of the spacer on the base substrate, so that the contact between the opening edge of the fine metal mask and the top of the spacer can be avoided, and foreign matters such as particles can be avoided. It should be noted that the above-mentioned "spaced apart from" refers to that the orthographic projection of the top of the spacer away from the base substrate on the base substrate and the orthographic projection of the light emitting portion on the base substrate have a certain interval therebetween and do not overlap or contact each other.

In some examples, as illustrated by FIG. 3, the shape of the orthographic projection of the spacer 160 on the base substrate 110 is a rounded rectangle. In this case, an orthographic projection of a central axis of the spacer 160, which extends along a length direction of the spacer 160, on the base substrate 110 is spaced from the edge of the orthographic projection of the first light emitting portion 171 on the base substrate 110. Therefore, the display substrate can avoid the contact between the opening edge of the fine metal mask and the top of the spacer, and avoid the generation of foreign matters such as particles, thereby improving the stability and reliability of the display substrate and the product yield. Of course, the shape of the orthographic projection of the spacer on the base substrate in the embodiment of the present disclosure includes but is not limited to the above-mentioned rounded rectangle, and can also be other shapes, such as ellipse, etc.

In some examples, as illustrated by FIG. 3, the distance between the orthographic projection of the central axis of the spacer 160, which extends along the length direction of the spacer 160, on the base substrate 110 and the edge of the orthographic projection of the first light emitting portion 171 on the base substrate 110 is greater than 6 microns. Therefore, the display substrate can effectively avoid the contact between the opening edge of the fine metal mask and the top of the spacer, and avoid the generation of foreign matters such as particles, thereby improving the stability and reliability of the display substrate and the product yield.

For example, as illustrated by FIG. 5B, the display substrate may further include a passivation layer 360 on a side of the first planarization layer 131 close to the base substrate 110. Of course, the embodiments of the present disclosure include but are not limited thereto, and the display substrate may not be provided with the passivation layer.

Figure 6:
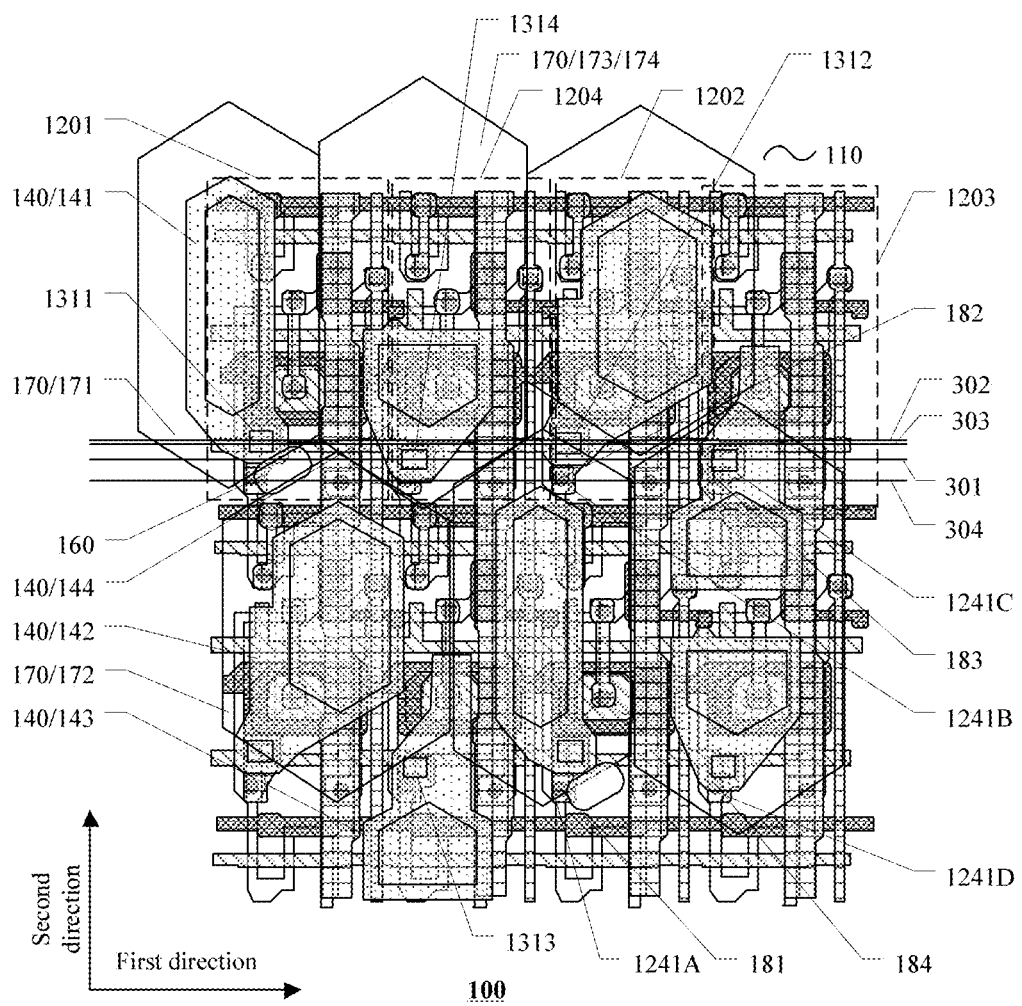
FIG. 6 is a schematic planar view of another display substrate according to an embodiment of the present disclosure.

FIG. 6 is a schematic planar view of another display substrate according to an embodiment of the present disclosure. As illustrated by FIG. 6, the orthographic projection of the spacer 160 on the base substrate 110 is spaced apart from the orthographic projection of the first via hole 1311 on the base substrate 110. That is to say, the orthographic projection of the spacer 160 on the base substrate 110 does not overlap with the orthographic projection of the first via hole 1311 on the base substrate 110, that is, the overlapping area between the orthographic projection of the spacer on the base substrate and the orthographic projection of the first via hole on the base substrate is zero. In this case, the display substrate can avoid the overlapping between the spacer and the first via hole, thereby further ensuring the integrity of the top of the spacer and avoiding the phenomenon that the top of the spacer is uneven. Therefore, the display substrate can effectively prevent the fine metal mask from scratching off the material on the spacer and generating particles, thereby further improving the product yield.

Figure 7:
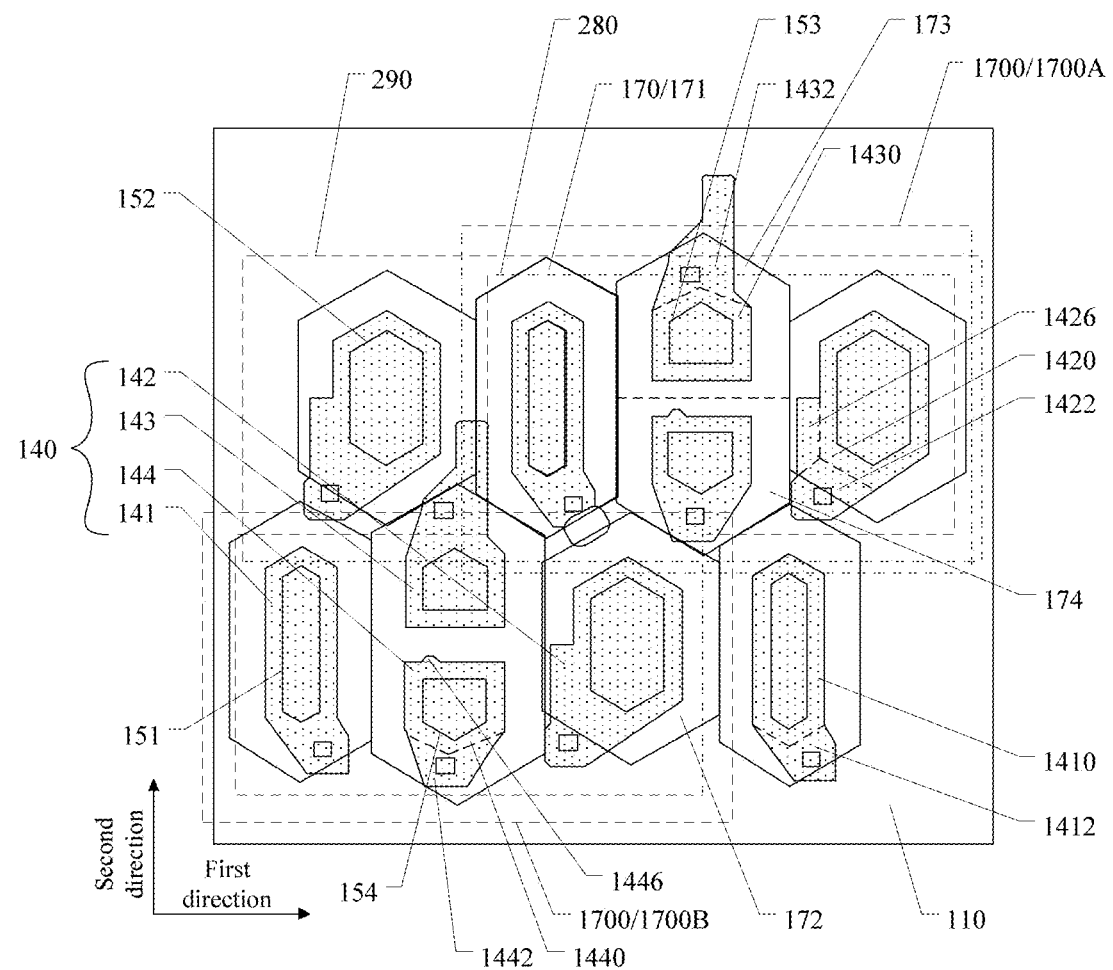
FIG. 7 is a schematic diagram of the arrangement of a light emitting functional layer on a display substrate according to an embodiment of the present disclosure.

FIG. 7 is a schematic diagram of the arrangement of a light emitting functional layer on a display substrate according to an embodiment of the present disclosure. As illustrated by FIG. 7, the light emitting functional layer 170 includes a plurality of light emitting groups 1700; the plurality of light emitting groups 1700 are arranged along the first direction to form a plurality of light emitting group columns 280 and arranged along the second direction to form a plurality of light emitting group rows 290. Each of the plurality of light emitting groups 1700 includes a first light emitting portion 171, a second light emitting portion 172, a third light emitting portion 173 and a fourth light emitting portion 174. The third light emitting portion 173 and the fourth light emitting portion 174 are arranged along the second direction to form a light emitting pair 175. The first light emitting portion 171, the light emitting part 175 and the second light emitting portion 172 are arranged along the first direction, and two adjacent light emitting group rows 290 offset from each other, for example, offset by ½ of a pitch, which is equal to the distance between the centers of two first light emitting portions 171 in two light emitting groups 1700 which are adjacent in the first direction. It should be noted that the center of the first light emitting portion can be a geometric center of the orthographic projection of the first light emitting portion on the base substrate. In addition, the light emitting portion is a light emitting layer evaporated by a fine metal mask among the plurality of light emitting functional layers, and does not include a common film layer formed on the whole surface and used for assisting the light emission, such as a hole transport layer and an electron transport layer.

For example, the second light emitting portion 172 and the third light emitting portion 173 can be a continuous integral structure, and can be formed by evaporation through one opening of the fine metal mask.

In some examples, the first light emitting portion is configured to emit light of a first color, the third light emitting portion and the fourth light emitting portion are configured to emit light of a second color, and the second light emitting portion is configured to emit light of a third color.

In some examples, the first color is red, the second color is green, and the third color is blue.

In some examples, as illustrated by FIGS. 3 and 6, the first planarization layer 131 further includes a second via hole 1312, a third via hole 1313 and a fourth via hole 1314; the anode layer 140 further includes a third anode 143 and a fourth anode 144; the pixel driving circuit layer 120 includes a second pixel driving circuit 1202, a third pixel driving circuit 1203 and a fourth pixel driving circuit 1204. The second anode 142 is connected with the second pixel driving circuit 1202 through the second via hole 1312, the third anode 143 is connected with the third pixel driving circuit 1203 through the third via hole 1313, and the fourth anode 144 is connected with the fourth pixel driving circuit 1204 through the fourth via hole 1314. The centers of the plurality of fourth via holes 1314 corresponding to each of the plurality of light emitting group rows 290 are approximately located on a first straight line 301 extending along the first direction, and the second via holes 1312 of the next light emitting group row 290 are also located on the first straight line 301. The orthographic projection of the first via hole 1311 on the base substrate 110 is located at a side of the first straight line 301 close to the first main body portion 1410. In this case, the display substrate moves "up" the positions of the first via holes, so that the overlapping area between the orthographic projection of the spacer on the base substrate and the orthographic projection of the first via hole on the base substrate is less than 20% of the area of the orthographic projection of the first via hole on the base substrate.

In some examples, as illustrated by FIGS. 3 and 6, the centers of the first via holes 1311 corresponding to each of the plurality of light emitting group rows 290 are located on a second straight line 302 extending along the first direction, and the centers of the second via holes 1312 corresponding to each of the plurality of light emitting group rows 290 are located on a third straight line 303 extending along the first direction. In the same one of the plurality of light emitting group rows 290, the second straight line 302 is located at a side of the third straight line 303 close to the first main body portion 1410. In some examples, as illustrated by FIGS. 3, 6 and 7, the orthographic projection of the top of the spacer 160 on the base substrate 110 is located between the orthographic projection of the first light emitting portion 171 on the base substrate 110, the orthographic projection of the fourth light emitting portion 174 on the base substrate 110, and the orthographic projection of the second light emitting portion 172 in the adjacent light emitting group 1700 in the second direction on the base substrate 110. With this arrangement, the display substrate can ensure that the orthographic projection of the top of the spacer on the base substrate is spaced apart from the orthographic projections of the first light emitting portion, the second light emitting portion, the third light emitting portion and the fourth light emitting portion on the base substrate, and make full use of the space on the display substrate. In some examples, as illustrated by FIGS. 3, 6 and 7, the second anode 142 includes a second main body portion 1420 and a second connection portion 1422, the second connection portion 1422 can be arranged in contact with the second light emitting portion 172, the second connection portion 1422 is electrically connected with the second pixel driving circuit 1202 through the second via hole 1312, and the third anode 143 includes a third main body portion 1430 and a third connection portion 1432, the third main body portion 1430 can be arranged in contact with the third light emitting portion 173, the third connection portion 1432 is electrically connected with the third pixel driving circuit 1203 through the third via hole 173, and the fourth anode 144 includes a fourth main body portion 1440 and a fourth connection portion 1442, the fourth connection portion 1442 is arranged in contact with the fourth light emitting portion 174, and the fourth connection portion 1442 is connected with the fourth pixel driving circuit 1203 through the fourth via hole 1314.

In some examples, as illustrated by FIGS. 3, 5A and 7, the fourth anode 144 may further include a first supplementary portion 1446; the first supplementary portion 1446 is located at a side of the fourth main body portion 1440 away from the fourth connection portion 1442, and the orthographic projection of the supplementary portion 1446 on the base substrate 110 covers the orthographic projection of a channel region of a compensation thin film transistor in the fourth pixel driving circuit 1204 on the base substrate 110. For example, a common electrode region between the two channel regions of the compensation thin film transistor in the pixel driving circuit 1204 corresponding to the fourth anode 144 can be blocked by the first supplementary portion 1446, so that the stability and service life of the compensation thin film transistor can be improved, and thus the long-term luminous stability and service life of the display substrate can be improved. In some examples, as illustrated by FIG. 3, FIG. 5A and FIG. 7, the pixel driving circuit layer 120 includes a second gate electrode layer 123, and the second gate electrode layer 123 may include a shielding electrode 1232. the shielding electrode 1232 can shield the common electrode region between the two channel regions of the compensation thin film transistor in the pixel driving circuit 1204 corresponding to the fourth anode 144 together with the above-mentioned first supplementary portion 1446, thereby further improving the stability and service life of the compensation thin film transistor, and thus, the long-term luminous stability and service life of the display substrate can be improved.

In some examples, as illustrated by FIGS. 3 and 7, the second anode 142 further includes a second supplementary portion 1426, and the channel region of the compensation thin film transistor in the second pixel driving circuit 1202 corresponding to the second anode 142 can be blocked by the second supplementary portion, so that the stability and service life of the compensation thin film transistor can be further improved, and thus the long-term luminous stability and service life of the display substrate can be improved.

In some examples, as illustrated by FIGS. 3, 6 and 7, the pixel defining layer 150 includes a first opening 151, a second opening 152, a third opening 153 and a fourth opening 154, the first light emitting portion 171 is at least partially located in the first opening 151 and covers an exposed part of the first main body portion 1410, and the second light emitting portion 172 is at least partially located in the second opening 152 and covers an exposed part of the second main body portion 1420. The third light emitting portion 173 is at least partially located in the third opening 153 and covers an exposed part of the third main body portion 1430, and the fourth light emitting portion 174 is at least partially located in the fourth opening 154 and covers an exposed part of the fourth main body portion 1440.

In some examples, as illustrated by FIGS. 3, 6 and 7, the shape of the first main body portion 1410 is substantially the same as that of the first opening 151; the shape of the second main body portion 1420 is substantially the same as that of the second opening 152; the shape of the third main body portion 1430 is substantially the same as that of the third opening 153; and the shape of the fourth main body portion 1440 is substantially the same as that of the fourth opening 154. For example, in the case where the shape of the fourth opening 154 is hexagonal, the shape of the fourth main body portion 1540 is also hexagonal. Of course, the shapes of the fourth opening and the fourth main body are not limited to hexagonal shape, and may be other shapes such as an ellipse shape.

In some examples, as illustrated by FIG. 3, FIG. 6 and FIG. 7, the shape of the first opening 151 on the base substrate 110 is hexagonal or elliptical, and the shape of the orthographic projection of the spacer 160 on the base substrate 110 is an elongated or rounded rectangle. An included angle between the long axis direction of the orthographic projection of the first opening 151 on the base substrate 110 and the extending direction of the long axis direction of the orthographic projection of the spacer 160 on the base substrate 110 ranges from 20 to 70 degrees.

In some examples, as illustrated by FIGS. 3, 6 and 7, the extending direction of the orthographic projection of the spacer 160 on the base substrate 110 is approximately parallel to the extending direction of an edge of the orthographic projection of the first opening 151 on the base substrate 110 close to the spacer 160.

For example, as illustrated by FIGS. 3, 6 and 7, the first direction and the second direction are substantially perpendicular. It should be noted that the case where the first direction and the second direction are substantially perpendicular to each other includes the case where the included angle between the first direction and the second direction is 90 degrees, and also includes the case where the included angle between the first direction and the second direction ranges from 85 to 95 degrees.

In some examples, as illustrated by FIG. 7, two light emitting groups 1700 adjacent in the second direction may be a first light emitting group 1700A and a second light emitting group 1700B. The orthographic projection of the top of spacer 160 on base substrate 110 is located among the orthographic projection of first light emitting portion 171 of first light emitting group 1700A on the base substrate 110, the orthographic projection of the fourth light emitting portion 174 of first light emitting group 1700A on the base substrate 110, the orthographic projection of the third light emitting portion 173 of the second light emitting group 1700B on the base substrate 110, and the orthographic projection of the second light emitting portion 172 of the second light emitting group 1700B on the base substrate 110. With this arrangement, the display substrate can ensure that the orthographic projection of the top of the spacer on the base substrate is spaced apart from the orthographic projections of the first light emitting portion, the third light emitting portion and the fourth light emitting portion of the first light emitting group and the second light emitting portion of the second light emitting group on the base substrate, and make full use of the space on the display substrate.

In some examples, as illustrated by FIGS. 3, 4 and 5A, the pixel driving circuit layer 120 includes a semiconductor layer 121, a first gate electrode layer 122, a second gate electrode layer 123 and a source drain metal layer 124; the semiconductor layer 121 is located on the base substrate 110, the first gate electrode layer 122 is located on a side of semiconductor layer 121 away from the base substrate 110, the second gate electrode layer 123 is located on a side of first gate electrode layer 122 away from semiconductor layer 121, and the source drain metal layer 124 is located on a side of second gate electrode layer 123 away from the base substrate 110. The source drain metal layer 124 includes a first drain electrode block 1241A, a second drain electrode block 1241B, a third drain electrode block 1241C and a fourth drain electrode block 1241D; the first drain electrode block 1241A serves as a drain electrode of the first pixel driving circuit 1201, the second drain electrode block 1241B serves as a drain electrode of the second pixel driving circuit 1202, the third drain electrode block 1241C serves as a drain electrode of the third pixel driving circuit 1203, and the fourth drain electrode block 1241D serves as a drain electrode of the fourth pixel driving circuit 1204.

In some examples, as illustrated by FIGS. 3, 4 and 5A, the first anode 141 is connected with the first drain electrode block 1241A through the first via hole 1311, the second anode 142 is connected with the second drain electrode block 1241B through the second via 1312, the third anode 143 is connected with the third drain electrode block 1241C through the third via hole 1313, and the fourth anode 144 is connected with the fourth drain electrode block 1241D through the fourth via hole 1314. A size of the first drain electrode block 1241A in the second direction is larger than that of the fourth drain electrode block 1241D in the second direction. With this arrangement, the first via hole connected with the first drain electrode block can be better moved "up", so that the overlapping area between the orthographic projection of the spacer on the base substrate and the orthographic projection of the first via hole on the base substrate is less than 20% of the area of the orthographic projection of the first via hole on the base substrate.

In some examples, as illustrated by FIG. 3, FIG. 4 and FIG. 5A, the display substrate 100 further includes an interlayer insulating layer 180 located at a side of the source drain metal layer 124 close to the semiconductor layer 121, the interlayer insulating layer 180 includes a first contact hole 181, a second contact hole 182, a third contact hole 183, and a fourth contact hole 184. The first drain electrode block 1241A is connected with the semiconductor layer 121 through the first contact hole 181, the second drain electrode block 1241B is connected with the semiconductor layer 121 through the second contact hole 182, the third drain electrode block 1241C is connected with the semiconductor layer 121 through the third contact hole 183, and the fourth drain electrode block 1241D is connected with the semiconductor layer 121 through the fourth contact hole 184. The first contact holes 181, the fourth contact holes 184 and the second contact holes 182 corresponding to each of the light emitting group rows 290 are located on a fourth straight line 304 extending along the first direction, and the second contact holes 182 corresponding to the next light emitting group row 290 are also located on the fourth straight line 304.

In some examples, as illustrated by FIGS. 3 and 6, the first via holes 1311 corresponding to each of the light emitting group rows 290 are located on the second straight line 302 extending along the first direction; the first straight line 301 is located between the fourth straight line 304 and the second straight line 302. For example, a distance between the second straight line 302 and the first straight line 301 is in the range of 3-5 microns, and the distance between the second straight line 302 and the fourth straight line 304 is in the range of 7-9 microns. FIGS. 8A-8D are schematic planar views of a plurality of film layers in a display substrate according to an embodiment of the present disclosure; FIG. 9 is an equivalent schematic diagram of a pixel driving circuit in a display substrate according to an embodiment of the present disclosure.

Figure 8A:
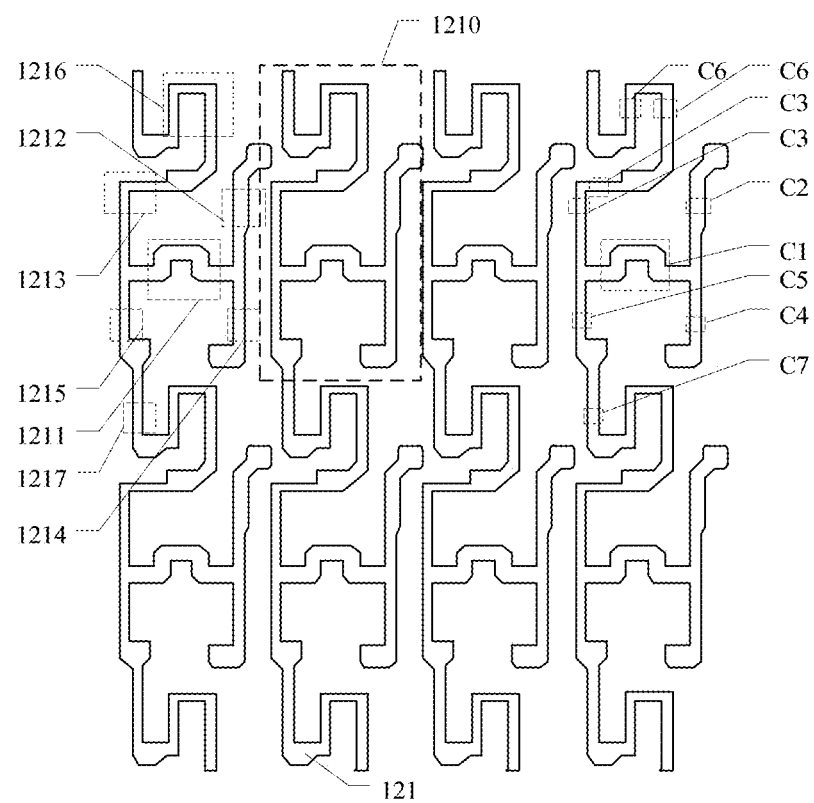
FIGS. 8A-8D are schematic planar views of a plurality of film layers in a display substrate according to an embodiment of the present disclosure.
Figure 9:
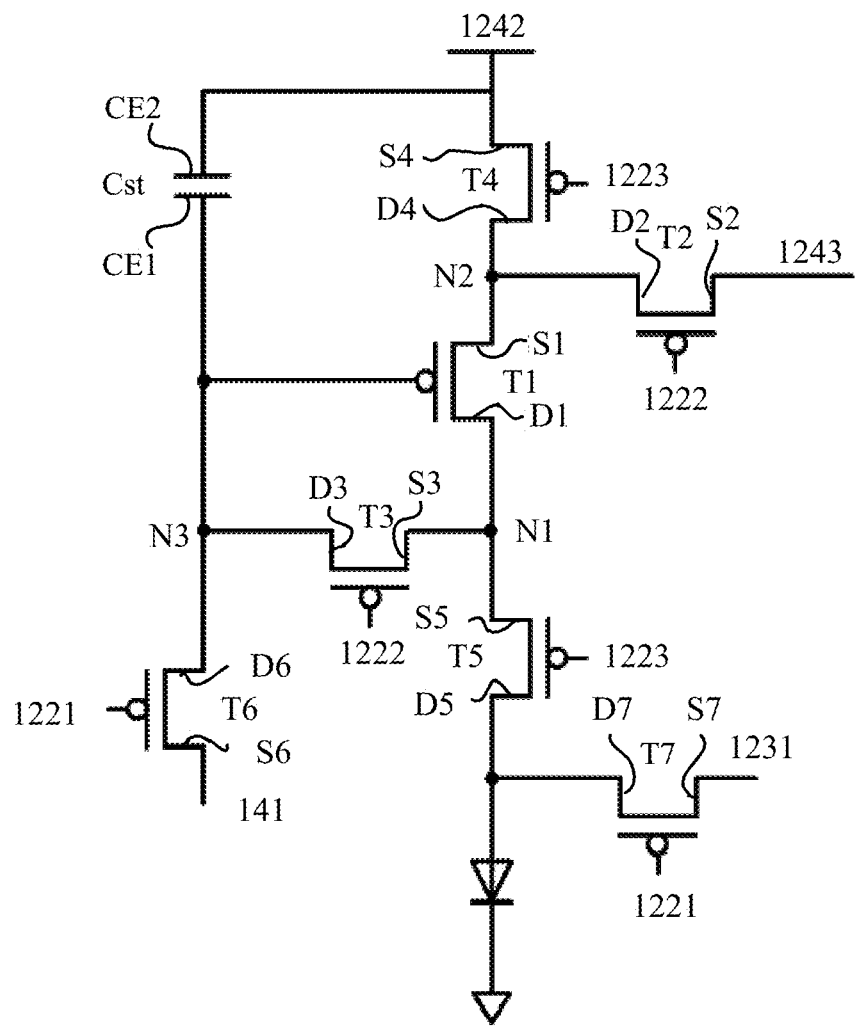
FIG. 9 is an equivalent schematic diagram of a pixel driving circuit in a display substrate according to an embodiment of the present disclosure.

In some examples, as illustrated by FIG. 8A, the semiconductor layer 121 includes a plurality of pixel driving units 1210 respectively arranged corresponding to the first anode 141, the second anode 142, the third anode 143 and the fourth anode 144. Each of the pixel driving units 1210 includes a first unit 1211, a second unit 1212, a third unit 1213, a fourth unit 1214, a fifth unit 1215, a sixth unit 1216 and a seventh unit 1217. The first unit 1211 includes a first channel region C1, and a first source region S1 and a first drain region D1 located at two sides of the first channel region C1; the second unit 1212 includes a second channel region C2, and a second source region S2 and a second drain region D2 located at two sides of second channel region C2, the third unit 1213 includes a third channel region C3, and a third source region S3 and a third drain region D3 located at two sides of the third channel region C3; the fourth unit 1214 includes a fourth channel region C4, and a fourth source region S4 and a fourth drain region D4 located at two sides of the fourth channel region C4; the fifth unit 1215 includes a fifth channel region C5, and a fifth source region S5 and a fifth drain region D5 located at two sides of the fifth channel region C5, the sixth unit 1216 includes a sixth channel region C6, and a sixth source region S6 and a sixth drain region D6 located at two sides of the sixth channel region C6, and the seventh unit 1217 includes a seventh channel region C7, and a seventh source region S7 and a seventh drain region D7 located at two sides of the seventh channel region C7.

As illustrated by FIGS. 8A and 9, the sixth drain region D6 is connected with the third drain region D3; the third source region S3, the first drain region D1 and the fifth source region S5 are connected to a first node N1; the first source region S1, the second drain region D2 and the fourth drain region D4 are connected to a second node N2; and the fifth drain region D5 is connected with the seventh drain region D7 of an adjacent row.

Figure 8B:
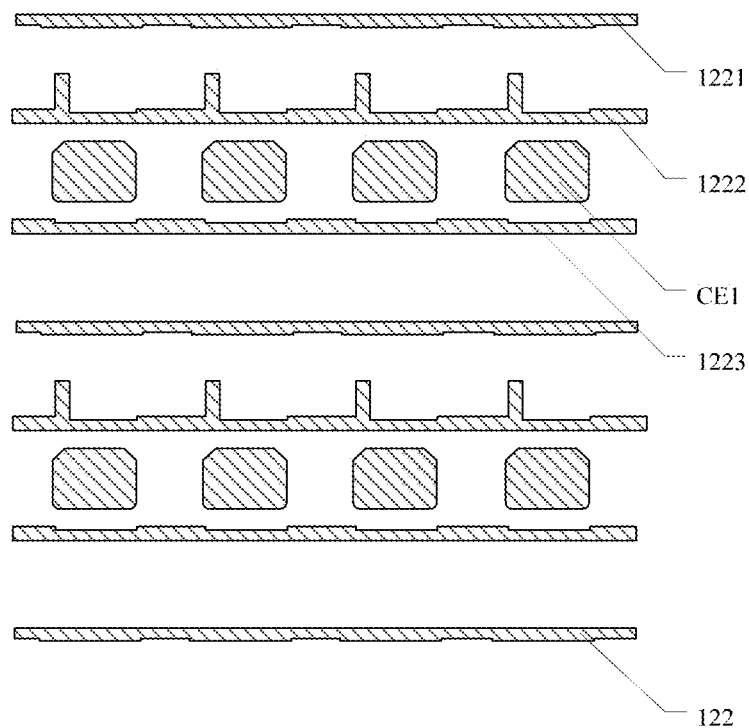

As illustrated by FIGS. 8B and 9, the first gate electrode layer 122 includes a reset signal line 1221, a gate line 1222, a first electrode plate CE1 and an emission control line 1223, and the reset signal line 1221 overlaps with the seventh channel region C7 and the sixth channel region C6 to form a seventh thin film transistor T7 and a sixth thin film transistor T6 with the seventh unit 1217 and the sixth unit 1216. The gate line 1222 overlaps with the third channel region C3 and the second channel region C2 to form a third thin film transistor T3 and a second thin film transistor T2 with the third unit 1213 and the second unit 1212, the first electrode plate CE1 overlaps with the first channel region C1 to form a first thin film transistor T1 with the first unit 1211, and the emission control line 1223 overlaps with the fourth channel region C4 and the fifth channel region C5 to form a fourth thin film transistor T4 and a fifth thin film transistor T5 with the fourth unit 1214 and the fifth unit 1215.

Figure 8C:
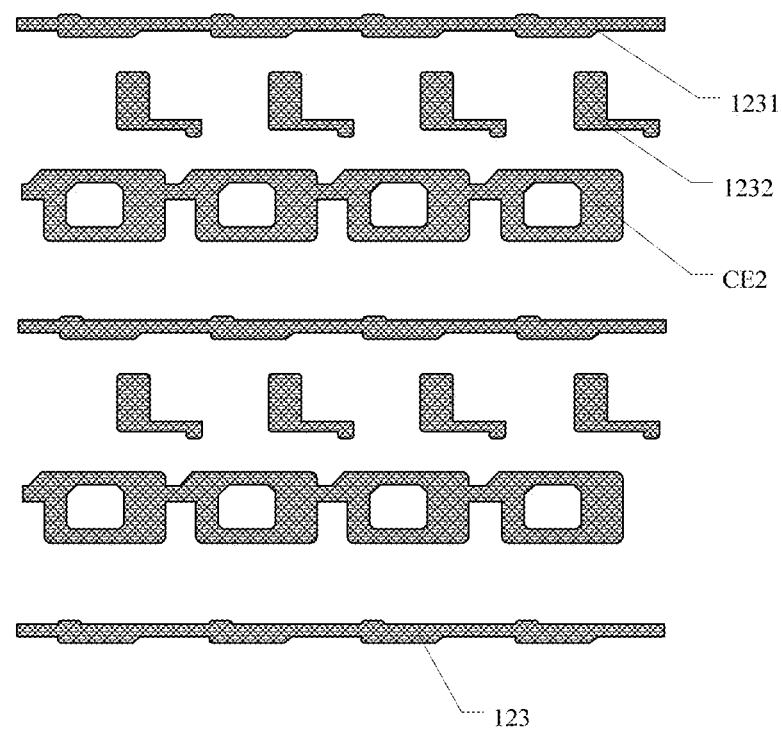

As illustrated by FIGS. 8C and 9, the second gate electrode layer 123 includes an initialization signal line 1231 and a second electrode plate CE2. The initialization signal line 1231 is connected with the seventh source region S7 and the sixth source region S6, and an orthographic projection of the second electrode plate CE2 on the base substrate 110 at least partially overlaps with an orthographic projection of the first electrode plate CE1 on the base substrate 110 to form a storage capacitor Cst.

Figure 8D:
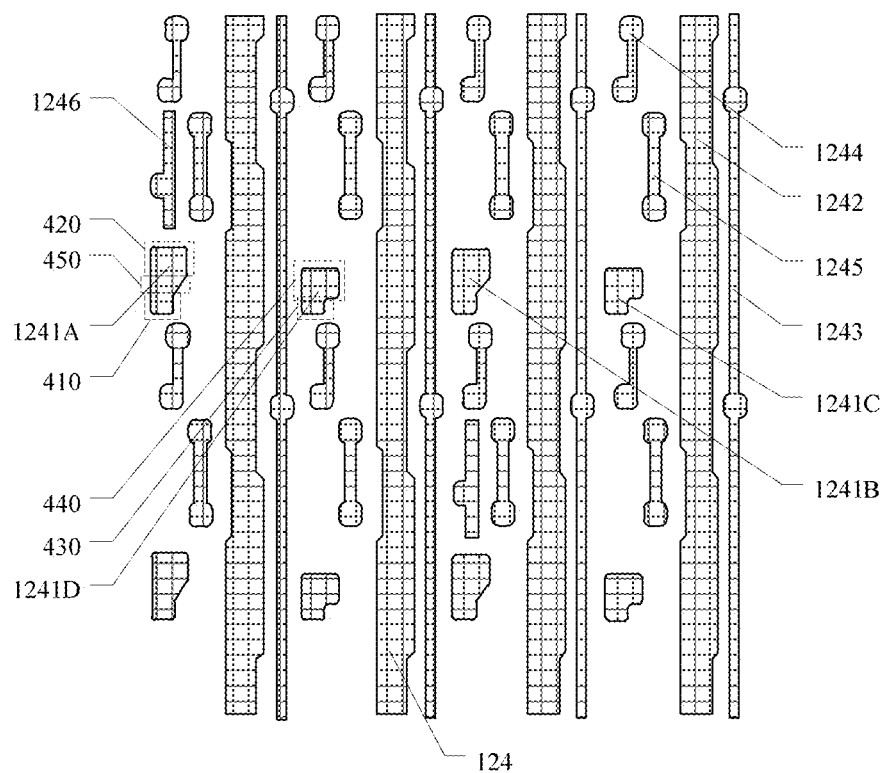

In some examples, as illustrated by FIGS. 3 and 8D, the source drain metal layer 124 further includes a power supply line 1242 and a data line 1243 which extend along the second direction; the orthographic projection of the spacer 160 on the base substrate 110 is spaced apart from the orthographic projection of the power supply line 1242 and the orthographic projection of the data line 1243 on the base substrate 110, respectively. Generally, the power supply line and the data line have a certain thickness, which makes it easy for the first planarization layer formed later to form protrusions at the positions where the power supply line and the data line are located. According to the display substrate, the orthographic projection of the spacer on the base substrate is spaced apart from the orthographic projection of the power supply line and the orthographic projection of the data line on the base substrate, so that the spacer does not overlap with the power supply line and the data line, thereby preventing the power supply line and the data line from damaging the integrity of the top of the spacer. Therefore, the display substrate can effectively prevent the fine metal mask from scratching off the material on the spacer and generating particles, thereby further improving the product yield.

In some examples, as illustrated by FIG. 8C, the second gate electrode layer 123 further includes a shielding electrode 1232. Referring to FIG. 3 and FIG. 5A, the shielding electrode 1332 can also be electrically connected with the power supply line 1242, for example, through a via hole. On the one hand, the shielding electrode 1232 is connected with a power supply line 1242 with a constant potential, so that the shielding electrode 1232 is prevented from being in a floating state. On the other hand, the shielding electrode 1232 can also reduce the resistance of the power supply line 1242.

In some examples, as illustrated by FIGS. 3 and 8D, the source drain metal layer 124 further includes a first connection block 1244 and a second connection block 1245. Referring to FIGS. 3 and 4, the first connection block 1244 connects the initialization signal line 1231 with the sixth source region S6 and the seventh source region S7, so that the signal on the initialization signal line 1231 can be applied to the sixth source region S6 and the seventh source region S7. The second connection block 1245 connects the third drain region S3 with the first electrode plate CE1. The orthographic projection of the spacer 160 on the base substrate 110 is spaced apart from the orthographic projection of the first connection block 1244 on the base substrate 110 and the orthographic projection of the second connection block 1245 on the base substrate 110, respectively. Similarly, the first connection block and the second connection block also have a certain thickness, which makes it easy for the first planarization layer formed later to form protrusions at the positions where the first connection block and the second connection block are located. According to the display substrate, the orthographic projection of the spacer on the base substrate is spaced apart from the orthographic projection of the first connection block on the base substrate and the orthographic projection of the second connection block on the base substrate, so that the spacer does not overlap with the first connection block and the second connection block, thereby preventing the first connection block and the second connection block from damaging the integrity of the top of the spacer. Therefore, the display substrate can effectively prevent the fine metal mask from scratching off the material on the spacer and generating particles, thereby further improving the product yield.

Hereinafter, an operation mode of the pixel driving circuit shown in FIG. 9 will be schematically described. First, when a reset signal is transmitted to the reset signal line 1221 and the seventh thin film transistor T7 is turned on, the residual current flowing through the anode of each sub-pixel is discharged to the sixth thin film transistor T6 through the seventh thin film transistor T7, so that light emission caused by the residual current flowing through the anode of each sub-pixel can be suppressed. Then, when a reset signal is transmitted to the reset signal line 1221 and an initialization signal is transmitted to the initialization signal line 1231, the sixth thin film transistor T6 is turned on, and an initialization voltage Vint is applied to the first gate electrode of the first thin film transistor T1 and the first electrode block CE1 of the storage capacitor Cst through the sixth thin film transistor T6, so that the first gate electrode and the storage capacitor Cst are initialized. The initialization of the first gate electrode can turn on the first thin film transistor T1.

Then, when a gate signal is transmitted to the gate line 1222 and a data signal is transmitted to the data line 1243, both the second thin film transistor T2 and the third thin film transistor T3 are turned on, and a data voltage Vd is applied to the first gate electrode G1 through the second thin film transistor T2 and the third thin film transistor T3. In this case, the voltage applied to the first gate electrode G1 is the compensation voltage Vd+Vth, and the compensation voltage applied to the first gate electrode G1 is also applied to the first electrode block CE1 of the storage capacitor Cst.

Thereafter, the power supply line 1242 applies a driving voltage Vel to the second electrode block CE2 of the storage capacitor Cst, and applies a compensation voltage Vd+Vth to the first electrode block CE1, so that charges corresponding to the difference between the voltages respectively applied to the two electrode plates of the storage capacitor Cst are stored in the storage capacitor Cst, and the first thin film transistor T1 is turned on for a predetermined time.

Subsequently, when an emission control signal is applied to the emission control line 1223, both the fourth thin film transistor T4 and the fifth thin film transistor T5 are turned on, so that the fourth thin film transistor T4 applies a driving voltage Vel to the fifth thin film transistor T5. When the driving voltage Vel passes through the first thin film transistor T1 turned on by the storage capacitor Cst, a driving current Id corresponding to the difference between the driving voltage Vel and the voltage applied to the first gate electrode through the storage capacitor Cst flows through the first drain region D1 of the first thin film transistor T1, and is applied to each sub-pixel through the fifth thin film transistor T5, so that the light emitting layer of each sub-pixel emits light.

In some examples, as illustrated by FIG. 8D, the first drain electrode block 1241A includes a first rectangular portion 410, a first wedge-shaped portion 450 and a second rectangular portion 420, the first rectangular portion 410 is connected with the semiconductor layer 121 through the first contact hole 181, an edge length of the second rectangular portion 420 is longer than that of the first rectangular portion 410, and a short bottom edge of the first wedge-shaped portion 450 is connected with the first rectangular portion 410, and a long bottom edge of the first wedge-shaped portion 450 is connected with the second rectangular portion 420. The fourth drain electrode block 1241D includes a third rectangular portion 430 and a fourth rectangular portion 440, the third rectangular portion 430 is connected with the semiconductor layer 121 through the third contact hole 183, and an edge length of the fourth rectangular portion 440 is longer than that of the third rectangular portion 430.

In some examples, as illustrated by FIG. 8D, the area of the first drain electrode block 1241A is larger than that of the second drain electrode block 1241B, the area of the second drain electrode block 1241B is larger than that of the fourth drain electrode block 1241D, and the area of the fourth drain electrode block 1241D is equal to that of the third drain electrode block 1241C.

In some examples, as illustrated by FIG. 4 and FIG. 8D, the source drain metal layer 124 further includes a cushion block 1246 located between the second connection block 1245 and the data line 1243, and the power supply line 1242 closest to the data line 1243 is located at a side of the data line 1243 away from the cushion block 1246. The orthographic projection of the data line 1243 on the base substrate 110 passes through the central part of the orthographic projection of the first main body portion 1410 on the base substrate 110, the orthographic projection of the cushion block 1246 on the base substrate 110 overlaps with the orthographic projection of the first main body portion 1410 on the base substrate 110, and the orthographic projection of the power supply line 1242 closest to the data line 1243 on the base substrate 110 overlaps the orthographic projection of the first main body portion 1410 on the base substrate 110. With this arrangement, the two sides of the central part of the first main body portion 1410 can be overlapped with the power supply line 1242 and the cushion block 1246 respectively by arranging the cushion block 1246, thereby avoiding the unevenness of the first main body portion 1410 caused by the uneven distribution of the underlying film layers, and further improving the display effect of the display substrate. It should be noted that the above-mentioned center part includes but is not limited to the geometric center of the orthographic projection of the first main body portion on the base substrate; for example, the above-mentioned central part is a circular area with the geometric center of the orthographic projection of the first main body portion on the base substrate as the center and ⅙ of the width of the orthographic projection of the first main body portion on the base substrate along the first direction as the radius.

For example, as illustrated by FIG. 4, the cushion block 1246 is electrically connected with the second electrode plate CE2 with a constant potential, so that the spacer 1246 has a constant potential, thereby improving the stability of the pixel driving circuit.

It should be noted that the array substrate shown in FIGS. 3, 4, 5A and 6 adopts a single SD structure, that is, the array substrate includes one source drain metal layer. However, embodiments of the present disclosure include but are not limited thereto, and the array substrate can also adopt a dual SD structure.

Figure 10:
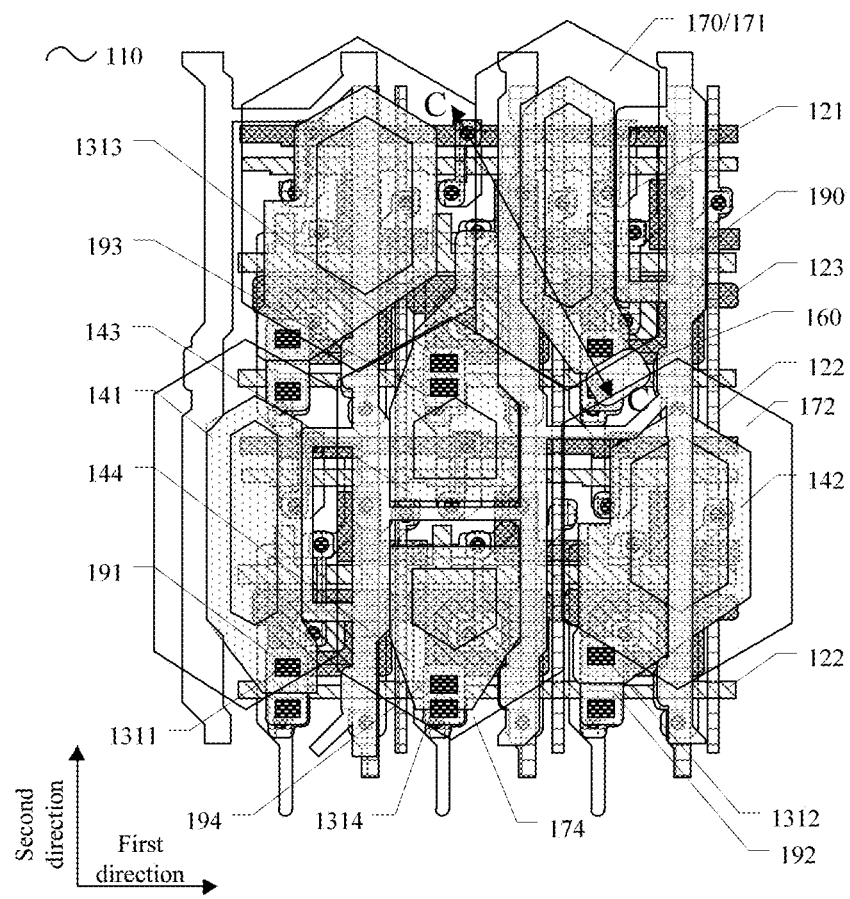
FIG. 10 is a schematic planar view of another display substrate according to an embodiment of the present disclosure.
Figure 11:
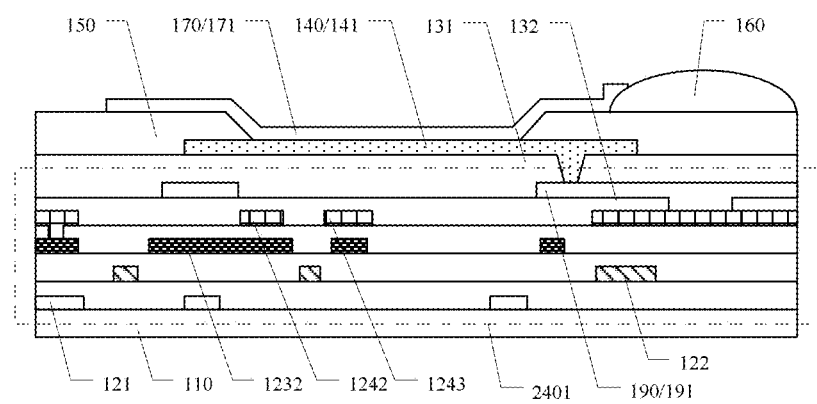
FIG. 11 is a schematic cross-sectional view of a display substrate according to an embodiment of the present disclosure along the CC direction in FIG. 10.

FIG. 10 is a schematic planar view of another display substrate according to an embodiment of the present disclosure. FIG. 11 is a schematic cross-sectional view of a display substrate according to an embodiment of the present disclosure along the CC direction in FIG. 10.

As illustrated by FIG. 10, the display substrate 100 further includes a base substrate 110, a pixel driving circuit layer 120, a second planarization layer 132, a conductive layer 190, a first planarization layer 131, an anode layer 140, a pixel defining layer 150, a spacer 160 and a light emitting functional layer 170. The pixel driving circuit layer 120 is located on the base substrate 110, the second planarization layer 132 is located at a side of the pixel driving circuit layer 120 away from base substrate 110, the conductive layer 190 is located at a side of second planarization layer 132 away from base substrate 110, the first planarization layer 131 is located at a side of conductive layer 190 away from base substrate 110, the anode layer 140 is located at a side of the first planarization layer 131 away from the pixel driving circuit layer 120, the pixel defining layer 150 is located at a side of the anode layer 140 away from the base substrate 110, the spacer 160 is located at a side of the pixel defining layer 150 away from the anode layer 140, and the light emitting functional layer 170 is located at a side of the anode layer 140 and the pixel defining layer 150 away from the base substrate 110.

As illustrated by FIGS. 10 and 11, the conductive layer 190 includes a first electrode block 191, a second electrode block 192, a third electrode block 193 and a fourth electrode block 194, the first electrode block 191 is connected with a drain electrode of the first pixel driving circuit 1201, the second electrode block 192 is connected with a drain electrode of the second pixel driving circuit 1202, the third electrode block 193 is connected with a drain electrode of the third pixel driving circuit 1203, and the fourth electrode block 194 is connected with a drain electrode of the fourth pixel driving circuit 1204. The first anode 141 is connected with the first electrode block 191 through the first via hole 1311, the second anode 142 is connected with the second electrode block 192 through the second via hole 1312, the third anode 143 is connected with the third electrode block 193 through the third via hole 1313, and the fourth anode 144 is connected with the fourth electrode block 194 through the fourth via hole 1314. A size of the first electrode block 191 in the second direction is larger than that of the third electrode block 193 in the second direction.

Figure 12:
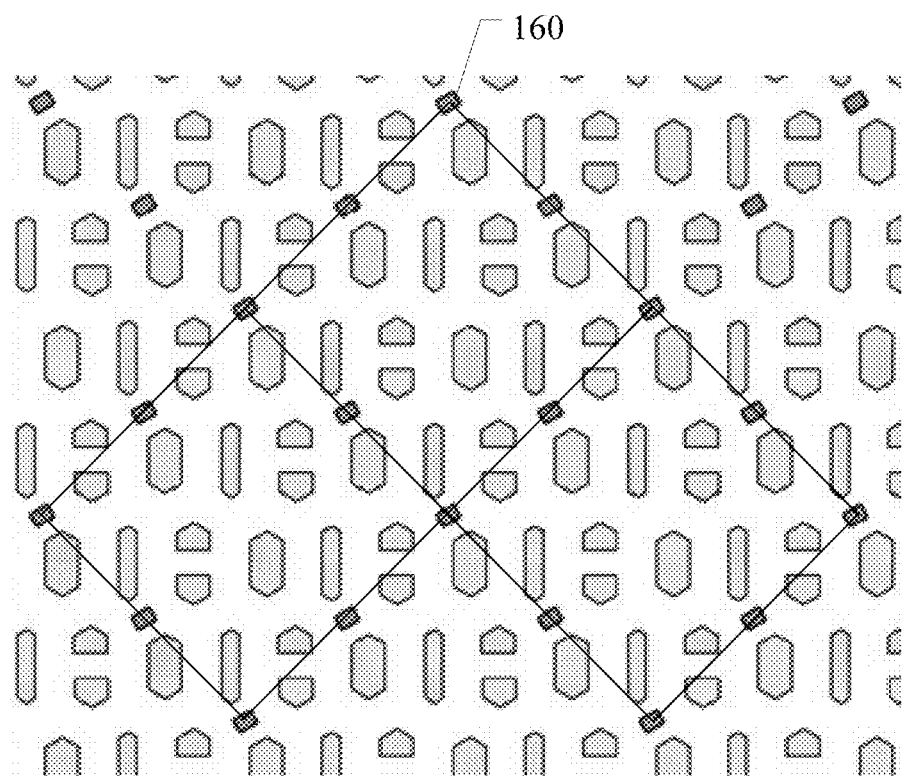
FIG. 12 is a schematic planar view of another display substrate according to an embodiment of the present disclosure.

FIG. 12 is a schematic planar view of another display substrate according to an embodiment of the present disclosure. As illustrated by FIG. 12, the display substrate 100 includes a plurality of spacers 160, and connecting lines of the centers the plurality of spacers 160 form a plurality of rhombic shapes. With this arrangement, the spacers of the display substrate can better support the mask plate.

Figure 13:
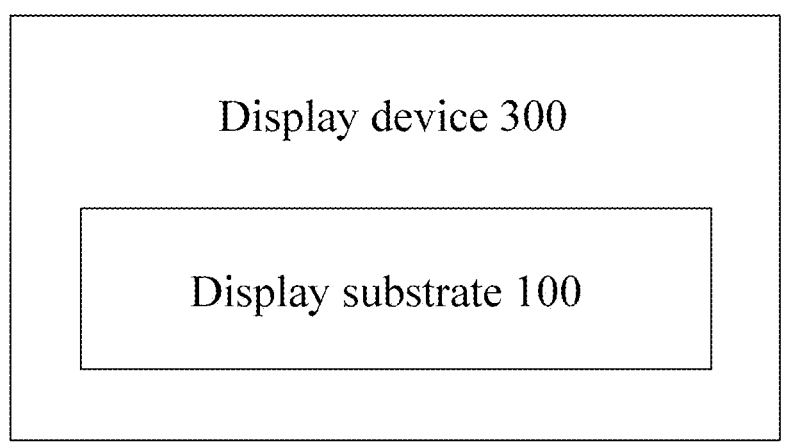
FIG. 13 is a schematic diagram of a display device according to an embodiment of the present disclosure.

FIG. 13 is a schematic diagram of a display device according to an embodiment of the present disclosure. As illustrated by FIG. 13, the display device 300 includes the display substrate 100 described above. Because the display device includes the display substrate, the display device can also reduce the overlapping area of the spacer and the first via hole, and even avoid the overlapping of the spacer and the first via hole, thereby ensuring the integrity of the top of the spacer and avoiding the phenomenon that the top of the spacer is uneven; the display substrate can prevent the fine metal mask from scratching off the material on the spacer and generating particles. Therefore, the display device can improve the product yield.

In some examples, the display device can be an electronic device with display function such as a television, a computer, a smart phone, a tablet computer, a navigator, and an electronic picture frame.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

The foregoing is merely exemplary embodiments of the disclosure, but is not used to limit the protection scope of the disclosure. The protection scope of the disclosure shall be defined by the attached claims.

The invention claimed is:

1. A display substrate comprising:
 a base substrate;
 a pixel driving circuit layer, located on the base substrate;
 a first planarization layer, located at a side of the pixel driving circuit layer away from the base substrate;
 an anode layer, located at a side of the first planarization layer away from the pixel driving circuit layer;
 a pixel defining layer, located at a side of the anode layer away from the base substrate;
 a spacer, located at a side of the pixel defining layer away from the anode layer; and
 a light emitting functional layer, located at a side of the anode layer and the pixel defining layer away from the base substrate, wherein the first planarization layer comprises a first via hole, the anode layer comprises a plurality of anode groups, the plurality of anode groups comprise a plurality of anode group rows, each of the plurality of anode group rows extends along a first direction, the plurality of anode group rows are arranged along a second direction, each of the plurality of anode groups comprises a first anode and a second anode, the first anode comprises a first main body portion and a first connection portion, the second anode comprises a second main body portion and a second connection portion, wherein the plurality of anode group rows comprise a first anode group row and a second anode group row which are adjacent in the second direction, the first main body portion in the first anode group row comprises a first long edge, the second main body portion, which is located in the second anode group row and adjacent to the first main body portion, comprises a second long edge, the first long edge is parallel to the second long edge, extending lines of the first long edge and the second long edge offset from each other, the spacer is located between the first main body portion in the first anode group row and the second main body portion which is located in the second anode group row and adjacent to the first main body portion, the pixel driving circuit layer comprises a first pixel driving circuit, the light emitting functional layer comprises a first light emitting portion, and the first connection portion is electrically connected with the first pixel driving circuit through the first via hole, and wherein an overlapping area between an orthographic projection of the spacer on the base substrate and an orthographic projection of the first via hole on the base substrate is less than 20% of an area of an orthographic projection of the first via hole on the base substrate.

2. The display substrate according to claim 1,
wherein at least two insulating layers are arranged between the anode layer and the base substrate, and the at least two insulating layers comprise at least one organic insulating layer, and an overlapping area between the orthographic projection of the spacer on the base substrate and an orthographic projection of a via hole in the organic insulating layer is less than 20% of an area of the orthographic projection of the via hole on the base substrate.

3. The display substrate according to claim 1,
wherein the orthographic projection of the spacer on the base substrate overlaps with an orthographic projection of the first connection portion on the base substrate.

4. The display substrate according to claim 1,
wherein a distance between an orthographic projection of a top of the spacer away from the base substrate on the base substrate and the orthographic projection of the first via hole on the base substrate is greater than 1 micron.

5. The display substrate according to claim 1,
wherein the orthographic projection of the spacer on the base substrate is spaced apart from the orthographic projection of the first via hole on the base substrate.

6. The display substrate according to claim 1,
wherein an orthographic projection of a top of the spacer away from the base substrate on the base substrate is spaced apart from an edge of the orthographic projection of the first light emitting portion on the base substrate.

7. The display substrate according to claim 1,
wherein the display substrate comprises a plurality of spacers, and connecting lines of centers of the plurality of spacers form a plurality of rhombic shapes.

8. The display substrate according to claim 1,
wherein the light emitting functional layer comprises a plurality of light emitting groups, the plurality of light emitting groups are arranged along a first direction to form a plurality of light emitting group columns and arranged along a second direction to form a plurality of light emitting group rows, wherein each of the plurality of light emitting group comprises a first light emitting portion, a second light emitting portion, a third light emitting portion and a fourth light emitting portion, the third light emitting portion and the fourth light emitting portion are arranged along the second direction to form a light emitting pair, the first light emitting portion, the light emitting pair and the second light emitting portion are arranged along the first direction, two adjacent ones of the plurality of light emitting group rows offset from each other, wherein the first planarization layer further comprises a second via hole, a third via hole and a fourth via hole, the anode layer further comprises a third anode and a fourth anode, the pixel driving circuit layer further comprises a second pixel driving circuit, a third pixel driving circuit, and a fourth pixel driving circuit, the second anode is connected with the second pixel driving circuit through the second via hole, the third anode is connected with the third pixel driving circuit through the third via hole, and the fourth anode is connected with the fourth pixel driving circuit though the fourth via hole, and wherein centers of multiple fourth via holes corresponding to each of the plurality of light emitting group rows are approximately located on a first straight line extending along the first direction, and the orthographic projection of the first via hole on the base substrate is located at a side of the first straight line close to the first main body portion.

9. The display substrate according claim 8,
wherein the fourth anode further comprises a supplementary portion, and an orthographic projection of the supplementary portion on the base substrate covers an orthographic projection of a channel region of a compensation thin film transistor in the fourth pixel driving circuit corresponding to the fourth anode on the base substrate.

10. The display substrate according to claim 8, further comprising:
a second planarization layer, located between the pixel driving circuit layer and the first planarization layer; and
a conductive layer, located between the second planarization layer and the first planarization layer,
wherein the conductive layer comprises a first electrode block, a second electrode block, a third electrode block and a fourth electrode block, the first electrode block is connected with a drain electrode of the first pixel driving circuit, the second electrode block is connected with a drain electrode of the second pixel driving circuit, the third electrode block is connected with a drain electrode of the third pixel driving circuit, the fourth electrode block is connected with a drain electrode of the fourth pixel driving circuit, and
wherein the first anode is connected with the first electrode block through the first via hole, the second anode is connected with the second electrode block through the second via hole, the third anode is connected with the third electrode block through the third via hole, and the fourth anode is connected with the fourth electrode block through the fourth via hole, a size of the first electrode block in the second direction is larger than a size of the fourth electrode block in the second direction.

11. The display substrate according to claim 8,
wherein the first light emitting portion is configured to emit light of a first color, the third light emitting portion and the fourth light emitting portion are configured to emit light of a second color, and the second light emitting portion is configured to emit light of a third color, and
wherein the first color is red, the second color is green, and the third color is blue.

12. The display substrate according to claim 8, wherein the first direction and the second direction are substantially perpendicular to each other.

13. The display substrate according to claim 8,
wherein centers of multiple first via holes corresponding to each of the plurality of light emitting group rows are approximately located on a second straight line extending along the first direction, and centers of multiple second via holes corresponding to each of the plurality of light emitting group rows are approximately located on a third straight line extending along the first direction, and
wherein in the same one of the plurality of light emitting group rows, the second straight line is located at a side of the third straight line close to the first main body portion.

14. The display substrate according to claim 13,
wherein an orthographic projection of a top of the spacer on the base substrate is located among an orthographic projection of the first light emitting portion on the base substrate, an orthographic projection of the fourth light emitting portion on the base substrate, and an orthographic projection of the second light emitting portion, which is in an adjacent light emitting group in the second direction, on the base substrate.

15. The display substrate according to claim 8,
wherein the pixel driving circuit layer comprises:
  a semiconductor layer, located on the base substrate; and
  a source drain metal layer, located at a side of the semiconductor layer away from the base substrate,
    wherein the source drain metal layer comprises a first drain electrode block, a second drain electrode block, a third drain electrode block and a fourth drain electrode block, the first drain electrode block serves as a drain electrode of the first pixel driving circuit, the second drain electrode block serves as a drain electrode of the second pixel driving circuit, the third drain electrode block serves as a drain electrode of the third pixel driving circuit and the fourth drain electrode block serves as a drain electrode of the fourth pixel driving circuit.

16. The display substrate according to claim 15,
wherein the source drain metal layer further comprises:
  a power supply line, extending along the second direction; and
  a data line, extending along the second direction,
    wherein the orthographic projection of the spacer on the base substrate is spaced apart from an orthographic projection of the power supply line and an orthographic projection of the data line on the base substrate, respectively.

17. The display substrate according to claim 15,
wherein the first anode is connected with the first drain electrode block through the first via hole, the second anode is connected with the second drain electrode block through the second via hole, the third anode is connected with the third drain electrode block through the third via hole, and the fourth anode is connected with the fourth drain electrode block through the fourth via hole, a size of the first drain electrode block in the second direction is larger than a size of the fourth drain electrode block in the second direction, and
wherein an area of the first drain electrode block is larger than an area of the second drain electrode block, the area of the second drain electrode block is larger than an area of the fourth drain electrode block, and the area of the fourth drain electrode block is equal to an area of the third drain electrode block.

18. The display substrate according to claim 17, further comprising:
an interlayer insulating layer, located at a side of the source drain metal layer close to the semiconductor layer, wherein the interlayer insulating layer comprises a first contact hole, a second contact hole, a third contact hole and a fourth contact hole, the first drain electrode block is connected with the semiconductor layer through the first contact hole, the second drain electrode block is connected with the semiconductor layer through the second contact hole, and the third drain electrode block is connected with the semiconductor layer through the third contact hole, the fourth drain electrode block is connected with the semiconductor layer through the fourth contact hole; and
multiple first contact holes, multiple fourth contact holes, and multiple second contact holes corresponding to each of the plurality of light emitting group rows are approximately located on a fourth straight line extending along the first direction.

19. The display substrate according to claim 15,
wherein the second anode comprises a second main body portion and a second connection portion, the second connection portion is electrically connected with the second pixel driving circuit through the second via hole, the third anode comprises a third main body portion and a third connection portion, the third connection portion is electrically connected with the third pixel driving circuit through the third via hole, and the fourth anode comprises a fourth main body portion and a fourth connection portion, the fourth connection portion is electrically connected with the fourth pixel driving circuit through the fourth via hole, and
wherein the pixel defining layer comprises a first opening, a second opening, a third opening and a fourth opening, the first light emitting portion is at least partially located in the first opening and covers an exposed part of the first main body portion, the second light emitting portion is at least partially located in the second opening and covers an exposed part of the second main body portion, the third light emitting portion is at least partially located in the third opening and covers an exposed part of the third main body portion, and the fourth light emitting portion is at least partially located in the fourth opening and covers an exposed part of the fourth main body portion.

20. The display substrate according to claim 19,
wherein a shape of an orthographic projection of the first opening on the base substrate is a hexagonal shape or an elliptical shape, and a shape of the orthographic projection of the spacer on the base substrate is an elongated shape or a rounded rectangular shape,
an included angle between a long axis direction of the shape of the orthographic projection of the first opening on the base substrate and an extending direction of the orthographic projection of the spacer on the base substrate is in a range from 20 to 70 degrees, and
wherein the extending direction of the orthographic projection of the spacer on the base substrate is approximately parallel to an extending direction of an edge, which is close to the spacer, of the orthographic projection of the first opening on the base substrate.

\* \* \* \* \*